(12) United States Patent
Holland et al.

(10) Patent No.: US 9,520,466 B2
(45) Date of Patent: Dec. 13, 2016

(54) VERTICAL GATE-ALL-AROUND FIELD EFFECT TRANSISTORS AND METHODS OF FORMING SAME

(71) Applicant: Taiwan Semiconductor Manufacturing Company, Ltd., Hsin-Chu (TW)

(72) Inventors: Martin Christopher Holland, Bertem (BE); Blandine Duriez, Brussels (BE); Mark van Dal, Linden (BE)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/659,262

(22) Filed: Mar. 16, 2015

(65) Prior Publication Data

US 2016/0276433 A1    Sep. 22, 2016

(51) Int. Cl.
| | |
|---|---|
| H01L 21/02 | (2006.01) |
| H01L 29/06 | (2006.01) |
| H01L 27/088 | (2006.01) |
| H01L 21/8234 | (2006.01) |
| H01L 29/66 | (2006.01) |
| H01L 29/78 | (2006.01) |
| H01L 29/20 | (2006.01) |
| H01L 29/423 | (2006.01) |
| H01L 21/8252 | (2006.01) |

(52) U.S. Cl.
CPC ....... *H01L 29/0676* (2013.01); *H01L 21/0262* (2013.01); *H01L 21/02538* (2013.01); *H01L 21/02603* (2013.01); *H01L 21/02639* (2013.01); *H01L 21/8252* (2013.01); *H01L 21/823487* (2013.01); *H01L 27/088* (2013.01); *H01L 29/20* (2013.01); *H01L 29/42392* (2013.01); *H01L 29/66522* (2013.01); *H01L 29/7827* (2013.01)

(58) Field of Classification Search
CPC .......... H01L 29/0676; H01L 21/02358; H01L 21/02603; H01L 27/088
See application file for complete search history.

(56) References Cited

U.S. PATENT DOCUMENTS

| 9,196,730 B1* | 11/2015 | Yu ........................ H01L 29/7845 |
| 2006/0011972 A1* | 1/2006 | Graham ................. B82Y 10/00 257/324 |
| 2010/0176459 A1* | 7/2010 | Wernersson ........... B82Y 10/00 257/392 |
| 2010/0261340 A1 | 10/2010 | Nijhawan et al. |
| 2010/0301390 A1 | 12/2010 | Ko et al. |
| 2011/0233512 A1* | 9/2011 | Yang ..................... B82Y 10/00 257/9 |

(Continued)

OTHER PUBLICATIONS

Heyns, M. et al., "Advancing CMOS beyond the Si roadmap with Ge and III/V devices," IEEE, Electron Devices Meeting (IEDM), Dec. 5-7, 2011, pp. 13.1.1-13.1.4.

(Continued)

*Primary Examiner* — Thanh V Pham
(74) *Attorney, Agent, or Firm* — Slater Matsil, LLP

(57) ABSTRACT

Semiconductor devices and methods of forming the same are provided. A template layer is formed on a substrate, the template layer having a recess therein. A plurality of nanowires is formed in the recess. A gate stack is formed over the substrate, the gate stack surrounding the plurality of nanowires.

20 Claims, 26 Drawing Sheets

(56) References Cited

U.S. PATENT DOCUMENTS

| | | | |
|---|---|---|---|
| 2011/0253981 A1* | 10/2011 | Rooyackers | B82Y 10/00 257/24 |
| 2013/0130481 A1 | 5/2013 | Chua et al. | |
| 2015/0249139 A1* | 9/2015 | Cheng | H01L 29/42392 438/504 |
| 2015/0380533 A1* | 12/2015 | Sandow | H01L 29/7395 257/139 |

OTHER PUBLICATIONS

Kawabe, Mitsuo et al., "Self-Annihilation of Antiphase Boundary in GaAs on Si(100) Grown by Molecular Beam Epitaxy," Japanese Journal of Applied Physics, vol. 26, No. 6, Jun. 1987, pp. L944-L946.

Kitahara, Kuninori et al,. "Observation of Atomic Structure by Scanning Tunneling Microscopy of Vicinal Si(100) Surface Annealed in Hydrogen Gas," Japanese Journal of Applied Physics, vol. 33, Part 2, No. 11B, Nov. 15, 1994, pp. L1571-L1573.

Kotlyar, V.G., et al., "Magic Nanoclusters of Group III Metals on Si(100) Surface," e-J. Surf. Sci. Nanotech, vol. 1 (2003), pp. 33-40.

Matthews, J.W. et al., "Defects in Epitaxial Multilayers," Journal of Crystal Growth, Mar. 27, 1974, North-Holland Publishsing Co., pp. 118-125.

Radosavljevic, M et al., "Non-Planar, Multi-Gate InGaAs Quantum Well Field Effect Transistors with High-K Gate Dielectric and Ultra-Scaled Gate-to-Drain/Gate-to-Source Separation for Low Power Logic Applications," IEEE, Electron Devices Meeting (IEDM), Dec. 6-8, 2010, pp. 6.1.1-6.1.4.

Radosavljevic, M. et al., "Electrostatics Improvement in 3-D Tri-gate Over Ultra-Thin Body Planar InGaAs Quantum Well Field Effect Transistors with High-K Gate Dielectric and Scaled Gate-to-Drain/Gate-to-Source Separation," IEEE, Electron Devices Meeting (IEDM), Dec. 5-7, 2011, pp. 33.1.1-33.1.4.

Tomioka, K, et al., "Growth of Highly Uniform InAs Nanowire Arrays by Selective-Area MOVPE," Journal of Crystal Growth 298 (2007) pp. 644-647.

Tomioka, K, et al., "Control of InAs Nanowire Growth Directions on Si," Nano Letters 2008, vol. 8, No. 10, pp. 3475-3480.

Van Dal, M.J.H. et al., "Demonstration of scaled Ge p-channel FinFETs integrated on Si," IEEE, Electron Devices Meeting (IEDM), Dec. 10-13, 2012, pp. 23.5.1-23.5.4.

Varrio, J., et al., "Model of Growth of Single-Domain GaAs Layers on Double-Domain Si Substrates by Molecular Beam Epitaxy," Appl. Phys. Lett., vol. 55, Issue 19, 1989, pp. 1987-1989.

* cited by examiner

VERTICAL GATE-ALL-AROUND FIELD EFFECT TRANSISTORS AND METHODS OF FORMING SAME

BACKGROUND

Transistors are key components of modern integrated circuits. To satisfy the requirements of increasingly faster switching speed, the drive currents of transistors need to be increasingly higher. At the same time, the gate lengths of transistors are constantly being scaled down. Scaling down the gate lengths leads to undesirable effects known as "short-channel effects," with which the control of current flow by the gates is compromised. Among the short-channel effects are the drain-induced barrier lowering (DIBL) and the degradation of sub-threshold slope, both of which result in the degradation in the performance of transistors.

The use of multi-gate transistor architecture may help the relief of short-channel effects by improving electrostatic control of the gate on the channel. Fin field-effect transistors (FinFET) were thus developed. To further increase the control of the channels, and to reduce the short-channel effects, transistors having gate-all-around (GAA) structures were also developed, wherein the respective transistors are also referred to as gate all around transistors. In a gate all around transistor, a gate dielectric and a gate electrode fully encircle the channel region. This configuration delivers a good control of the channel, and the short-channel effects are reduced.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 9A-16A illustrate various top views of a fabrication process of a semiconductor device in accordance with some embodiments.

FIGS. 9B-16B illustrate various cross-sectional views of a fabrication process of a semiconductor device in accordance with some embodiments.

FIGS. 18A-25A illustrate various top views of a fabrication process of a semiconductor device in accordance with some alternative embodiments.

FIGS. 18B-25B illustrate various cross-sectional views of a fabrication process of a semiconductor device in accordance with some alternative embodiments.

DETAILED DESCRIPTION

Figure 1:
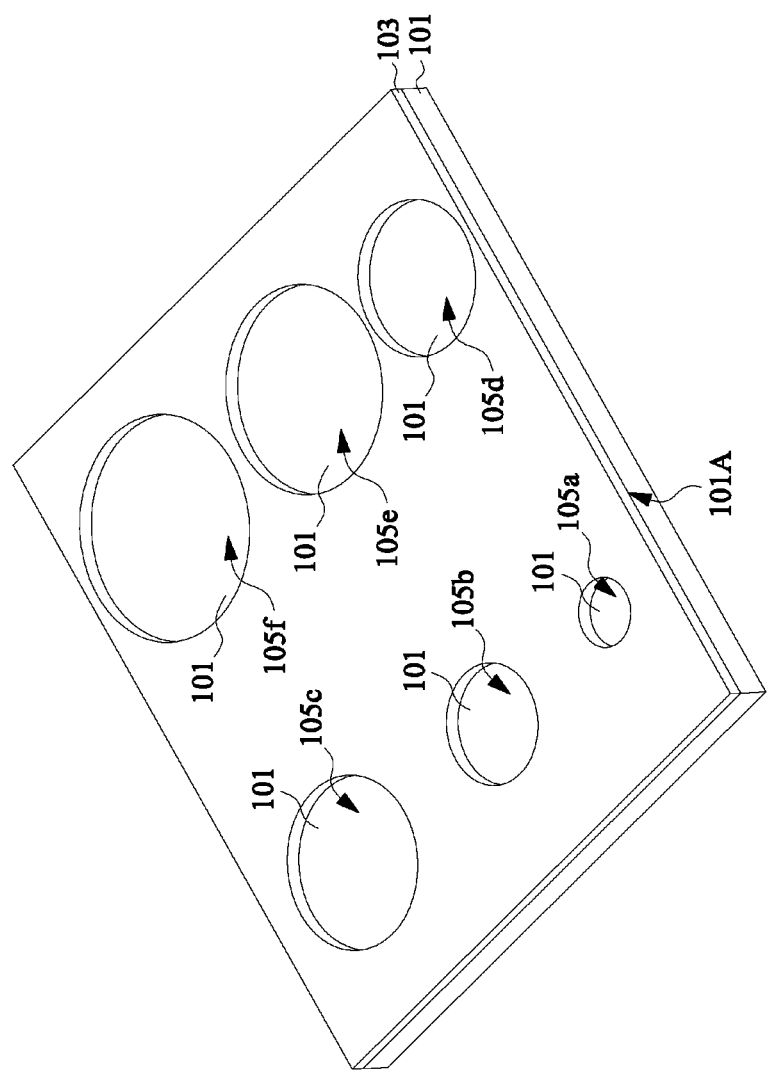
FIGS. 1 through 4 illustrate perspective views of intermediate stages in the formation of nanowires in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Field effect transistors (FETs) and methods of forming the same are provided in accordance with various exemplary embodiments. The intermediate stages of forming the FETs are illustrated. Variations of the embodiments are discussed. Throughout the various views and illustrative embodiments, like reference numbers are used to designate like elements.

Embodiments such as those described herein provide FET devices with one or more vertical channels with each channel formed of a nanowire comprising a III-V semiconductor material. The use of vertical nanowires allows for forming FET devices in a vertical-gate-all-around (VGAA) configuration, where gate stacks wrap around vertical channels for improved gate control. Such FET devices may be also referred to as VGAA FET devices. Furthermore, the use of multiple narrow nanowires provides improved gate control, while at the same time maintaining a high ON current $I_{ON}$. In addition, as described below in greater detail, nanowires are formed by an epitaxial growth method and, as such, avoid surface damage usually associated with nanowires formed using lithography and etch processes. Furthermore, widths of nanowires are defined by parameters of the epitaxial growth process are not limited by shortcomings of lithography and etch processes.

FIGS. 1 through 4 are perspective views of intermediate stages in formation of nanowires in accordance with some embodiments. Referring first to FIG. 1, a portion of a substrate 101 is shown having a template layer 103 formed thereon. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like.

In some embodiments when the substrate 101 is a silicon substrate, the substrate 101 may be a (111) substrate or a (100) substrate, wherein a top surface 101A of the substrate 101 is a (111) plane or a (100) plane of crystalline silicon, respectively. As described below in greater detail, in some embodiments, portions of the substrate 101 are implanted with p-type impurities (such as boron or indium) or n-type impurities (such as phosphorous, arsenic, or antimony). The implanted regions (not explicitly shown) have reduced resistivity, and hence may act as source/drain regions for subsequently formed devices, such as, for example, FET devices.

Further referring to FIG. 1, the template layer 103 is formed on the substrate 101. In accordance with some embodiments, the template layer 103 comprises a dielectric material. Exemplary materials of the template layer 103 include, and are not limited to, silicon nitride, silicon oxide, aluminum oxide, silicon carbide, and silicon oxynitride. The formation of the template layer 103 may include a deposition method such as, for example, Chemical Vapor Deposition (CVD), Plasma-Enhanced Chemical Vapor Deposition (PECVD), Low-Pressure Chemical Vapor Deposition (LPCVD), and the like. The template layer 103 may also be formed by performing a thermal oxidation on the substrate 101, and the resulting template layer 103 is an oxide layer comprising, for example, silicon oxide.

The template layer 103 is patterned to form openings 105a-105f in the template layer 103. In an embodiment where the top surface 101A of the substrate 101 is a (111) surface, the substrate 101 is exposed through the openings 105a-105f. In the illustrated embodiment, top-view shapes of the openings 105a-105f are circles. However, in other embodiments, the top-view shapes of the openings 105a-105f may be polygons such as triangles, rectangles, hexagons, or the like. In some embodiments, lateral dimensions of the openings 105a-105f may be between about 20 nm and about 400 nm. In the illustrated embodiment, the openings 105a-105f have different lateral dimensions and are formed in an irregular manner in the template layer 103. In other embodiments, the openings 105a-105f may have same lateral dimensions and may form a regular array of openings in the template layer 103. One having ordinary skill in the art would appreciate that locations, lateral dimensions, and a number of the openings may vary according to design requirements.

In some embodiments, the template layer 103 is patterned using photolithography techniques to form the openings 105a-105f. In some embodiments, a photoresist material (not shown) is formed over the template layer 103, which is then masked, exposed, and developed. After the photoresist material is patterned, an etch processes may be performed to remove unwanted portions of the underlying template layer 103. Additional masks (not shown), for example, hard masks, may be utilized during the etch process. Subsequently, the photoresist material may be removed using, for example, an ashing process combined with a wet clean process. In an embodiment where the template layer 103 comprises silicon oxide, the template layer 103 may be etched using, for example, a wet etch process with a Buffered Oxide Etch (BOE) solution, or a dry plasma etch with etchant gases such as $CF_4$, $SF_6$, $NF_3$, and the like. A typical BOE solution comprises a mixture of 40% solution of $NH_4F$ in water and 49% solution of HF in water.

As described below in greater detail, nanowires will be formed on the substrate 101 in the openings 105a-105f. The size of the openings 105a-105f is used to control the number and/or the size of the nanowires. Accordingly, the template layer 103 is patterned according to the desired location and the desired size of the subsequently formed nanowires. Furthermore, as described below in greater detail, the size of the nanowires is further controlled by process conditions. Accordingly, some of the openings 105a-105f may be masked and the process conditions altered to grow the nanowires of different sizes in different openings 105a-105f. As such, nanowires of various sizes may be formed on the substrate 101 based on design requirements for the devices to be formed on the substrate 101.

Figure 2:
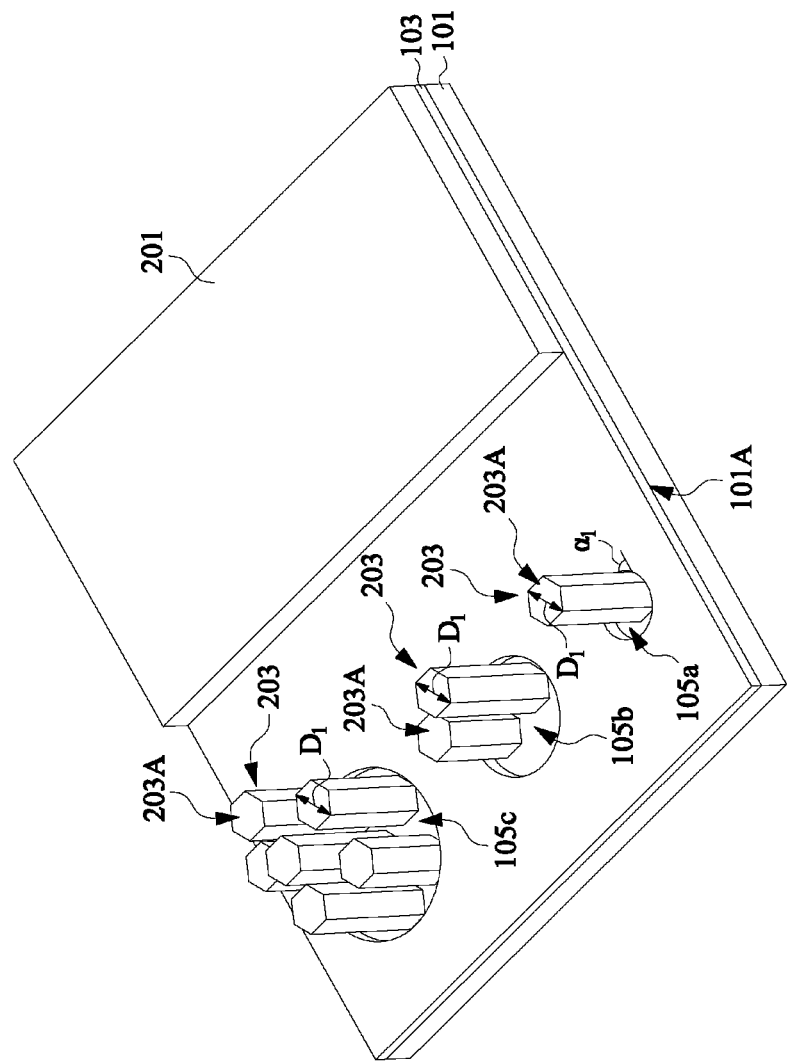

Referring to FIG. 2, a first mask layer 201 is formed over the template layer 103 to protect the openings 105d-105f from further processing steps that are performed on a portion of the substrate 101 exposed through the openings 105a-105c. In some embodiments, the first mask layer 201 may comprise of silicon nitride, silicon oxide, aluminum oxide, silicon carbide, and silicon oxynitride, and the like, and may be formed using, for example, thermal oxidation, CVD, PECVD, LPCVD, and the like. In some embodiments, the first mask layer 201 and the template layer 103 are formed of different materials having different etch selectivities, thereby allowing the first mask layer 201 to be selectively removed during subsequent processes.

Referring further to FIG. 2, the first nanowires 203 are grown from the portions of the substrate 101 exposed by the openings 105a-105c. In some embodiments, the first nanowires 203 may comprise III-V compound semiconductor materials, and may be epitaxial grown using a selective-area Metal-Organic Chemical Vapor Deposition (MOCVD). Typical group III materials may include gallium (Ga), indium (In), and aluminum (Al), and suitable precursors thereof may include trimethyl indium (TMIn), triethyl gallium (TEGa), trimethyl gallium (TMGa), trimethyl aluminum (TMAl), tritertiarybutyl aluminum (TTBAl), and the like. Typical group V materials may include arsenic (As), antimony (Sb), phosphorus (P), and bismuth (Bi), and suitable precursors thereof may include tributyl arsenic (TBA), arsine ($AsH_3$), phosphine ($PH_3$), tributyl phosphorus (TBP), trimethyl antimony (TMSb), triethyl antimony (TESb), triphenyl bismuth (TPB), and the like. In some embodiments in which indium (In) is included in the first nanowires 203 that are to be grown, indium itself acts as a catalyst, and no metal catalyst such as gold (Au) is needed for growing the first nanowires 203. The first nanowires 203 may thus be grown directly from the top surface 101A of the substrate 101.

Generally, a direction of growth for the nanowires is affected by surface properties of an underlying material. A nanowire comprising a III-V compound semiconductor material tends to predominantly grow along a <111>B direction, which is perpendicular to a (111)B surface of the III-V compound semiconductor material. The (111)B surface is a group-V atom exposed (111) surface of the III-V compound semiconductor material. Thus, a nanowire grown on the (111)B surface is substantially perpendicular to the (111)B surface. On the other hand, a nanowire formed on a (111)A surface, which is a group-III atom exposed (111) surface of the III-V compound semiconductor material, may grow along three equivalent <111>B directions, which form about 19.6° with the (111)A surface. Depending on the orientation of the top surface 101A of the substrate 101, the nanowires of various orientations may be formed on the substrate 101. In some embodiments, tilted nanowires are formed on a (100) silicon substrate, since the <111>B direction forms a non-perpendicular angle with the (100) plane. In other embodiments, nanowires formed on a (111) silicon substrate may grow along a vertical or three equivalent tilted <111>B directions, since the (111) surface of the (111) silicon substrates has a non-polar nature. As described below in greater detail, the top surface 101A of the substrate 101 is conditioned to allow for nanowires that are substantially perpendicular to the top surface 101A of the substrate 101. By forming vertical nanowires on the substrate 101 device integration may be improved.

Referring further to FIG. 2, in some embodiments where the substrate 101 is a (111) silicon substrate, the top surface 101A of the substrate 101 is conditioned such that the top surface 101A is transformed into a (111)B surface. Accordingly, the first nanowires 203 grown from the top surface 101A of the substrate 101 are substantially perpendicular to the top surface 101A. Each of the first nanowires 203 grown along the <111>B direction has a hexagonal cross-section with a top surface 203A being the (111)B surface, and has a sidewall with six facets {-110} perpendicular to the top surface 203A. Moreover, the first nanowires 203 have substantially the same first lateral dimension $D_1$, which can be controlled by tuning various parameters of the epitaxial growth as described below in greater detail. In some embodiments, the first lateral dimension $D_1$ is between about 5 nm and about 80 nm.

In the illustrated embodiment, a length of the first nanowires 203 varies from one nanowire to another. As described below in greater detail, lengths of the nanowires depend on a nucleation time and the growth duration. In some embodiments when the growth duration is identical for all the first nanowires 203, the length variation is due to a difference between nucleation times of the first nanowires 203. In some embodiments, the growth duration is between about 1 s and 50 s, and the first nanowires 203 have a length between about 50 nm and about 5 µm.

Referring further to FIG. 2, one or more first nanowires 203 may grow from the substrate 101 in the openings 105a-105c. In the illustrated embodiment, a single first nanowire 203 is formed in the opening 105a, two first nanowires 203 are formed in the opening 105b, and six first nanowires 203 are formed in the opening 105c. Depending on the first lateral dimension $D_1$ of the first nanowires 203 and the lateral dimensions of the openings 105a-105c, the openings 105a-105c may accommodate a maximum number of the first nanowires 203. For example, an opening in the template layer 103 having a lateral dimension about 50 nm may accommodate at most one nanowire having a lateral dimension about 35 nm, an opening in the template layer 103 having a lateral dimension about 73 nm may accommodate at most two nanowires having a lateral dimension about 35 nm, and an opening in the template layer 103 having a lateral dimension about 93 nm may accommodate at most three nanowires having a lateral dimension about 35 nm.

Referring further to FIG. 2, after forming the first mask layer 201 over the template layer 103, the top surface 101A of the substrate 101 exposed by the openings 105a-105c is cleaned to remove portions of the template layer 103 that may still remain in the openings 105a-105c. In some embodiments where the template layer 103 comprises silicon oxide, the residual oxide may be removed, for example, using a dry etch process such a SiConi™ etch process developed by Applied Materials, Inc., followed by an anneal process performed at a temperature about 100° C. for a duration about 60 s. In other embodiments, the residual oxide may be removed using a wet etch process with 0.7% HF solution in water for a duration about 60 s.

After performing the cleaning process, the substrate 101 is transferred into a MOCVD chamber to grow the first nanowires 203. In some embodiments, the top surface 101A of the substrate 101 is subject to a further cleaning process to remove a native oxide layer (not shown) that is formed on the top surface 101A of the substrate in the openings 105a-105c during the transferring of the substrate 101 into the MOCVD chamber. The top surface 101A of the substrate 101 is cleaned by heating the substrate 101 to a temperature between about 700° C. and about 800° C. in a hydrogen ($H_2$) atmosphere for a duration between about 1 min to 10 min. In some embodiments, a flow rate of $H_2$ is between about 500 sccm and about 50000 sccm.

In some embodiments, after the cleaning process is completed, the substrate 101 is cooled down to a temperature between about 400° C. and about 500° C. in the $H_2$ atmosphere. The cool down process allows a reconstruction of the top surface 101A of the substrate 101 and ensures that the top surface 101A is a 1X1 reconstructed (111) surface, which is equivalent to an unreconstructed (111) surface of the substrate 101. As described below in greater detail, the 1X1 reconstructed (111) surface is further conditioned to transform the top surface 101A into a (111)B-like surface, which is beneficial for growing vertical (along the <111>B direction) first nanowires 203.

After forming the 1X1 reconstructed top surface 101A, the top surface 101A is conditioned to transform the top surface 101A of the substrate into the (111)B-like surface. In some embodiments, a group V precursor is introduced in the MOCVD chamber. For example, when the first nanowires 203 to be grown comprise InAs, tributyl arsenic (TBA) or arsine ($AsH_3$) may be used as a precursor for providing arsenic (As). The group V atoms, such as As, terminate the top surface 101A of the substrate 101 to transform the 1X1 reconstructed (111) surface into the (111)B-like surface. In some embodiments, a flow rate of the group V precursor, such as TBA or $AsH_3$, is between about 100 sccm and about 800 sccm.

Subsequently, the substrate 101 is heated to a temperature between about 540° C. and about 580° C. and a group III precursor, such as trimethyl indium (TMIn), is introduced in the MOCVD chamber to start a growth process of the first nanowires 203. In some embodiments, a flow rate of the group III precursor, such as trimethyl indium (TMIn), is between about 300 sccm and 1000 sccm. In some embodiments, a growth duration is between about 1 s and 50 s, which allows for the first nanowires 203 having lengths between about 50 nm and 5 µm. The growth of the first nanowires 203 starts with a nucleation of the first nanowires 203. Generally, nucleation is promoted by roughness of the top surface 101A of the substrate 101 and a location of the nucleation determines a location of a subsequently formed first nanowire 203. In some embodiments, after forming the first nanowires 203, the substrate 101 is cooled to a temperature about 300° C. under a flow of the Group V precursor.

In some embodiments, heating the substrate 101 to the temperature between about 540° C. and about 580° C. promotes vertical growth (along the <111>B) rather than radial growth (along <-110> directions) of the first nanowire 203. Furthermore, to minimize radial growth of the first nanowires 203, a low V/III precursor ratio (the flow rate ratio of the group V precursor to group III precursor) may be used. For example, when the precursors include $AsH_3$ and TMIn, the $AsH_3$/TMI ratio may be between about 1 and about 20. Accordingly, by controlling the temperature of the substrate 101 and the V/III precursor ratio, the first lateral dimension $D_1$ of the first nanowires 203 can be also controlled. As such, all the first nanowires 203 have substantially the same first lateral dimension $D_1$, which is controlled by MOCVD parameters and not by the lateral dimensions of the openings 105a-105b. In some embodiments, the first lateral dimension $D_1$ of the first nanowires 203 may be tuned to be less than the lateral dimensions of the openings 105a-105c and one or multiple first nanowires 203 may be formed in the openings 105a-105c depending on the lateral dimensions of the openings 105a-105c.

Through the adjustment of selective-area MOCVD process conditions, the first nanowires 203 grow vertically without expanding laterally. Accordingly, top portions, bottom portions, and intermediate portions of the first nanowires 203 have the same first lateral dimensions $D_1$ and shapes. The sidewalls of the first nanowires 203 are perpendicular to or substantially perpendicular to the top surface 101A of the substrate 101, for example, with a tilt angle $\alpha_1$ being about 90°.

Figure 3:
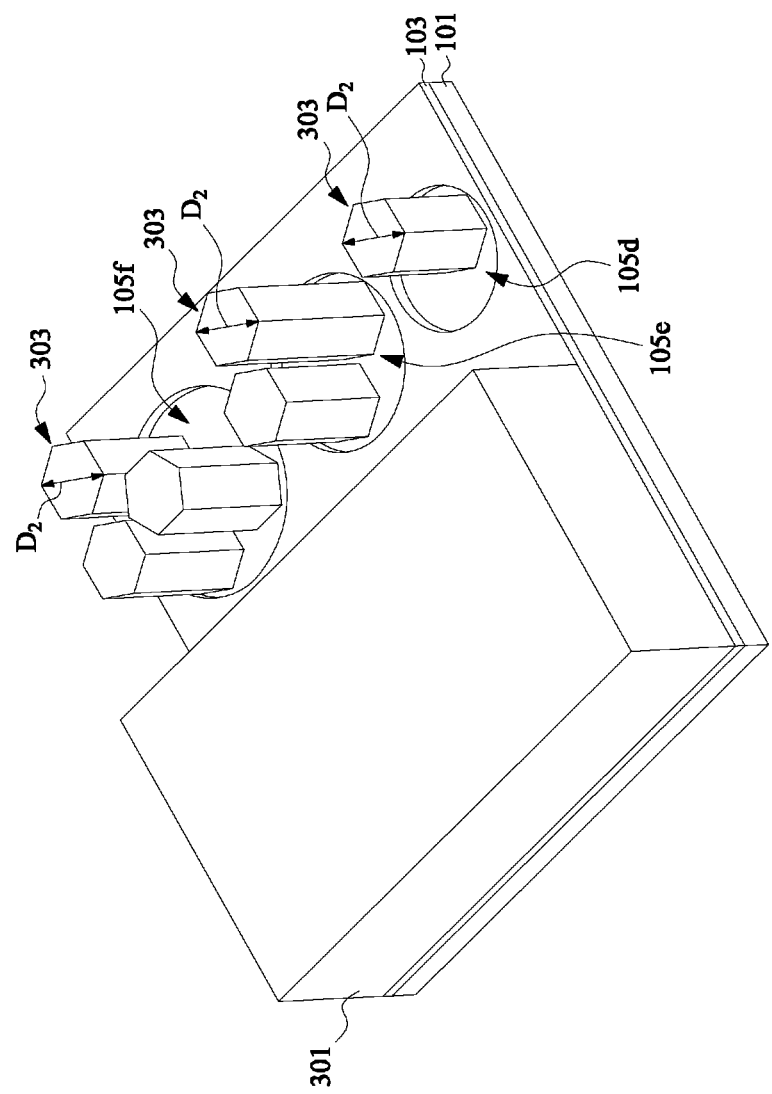

Referring to FIG. 3, the second nanowires 303 are formed on the substrate 101 in the openings 105d-105f. After forming the first nanowires 203, the first mask layer 201 is removed to expose the openings 105d-105f. In some embodiments, the first mask layer 201 may be selectively removed using a suitable etch process. Subsequently, a second mask layer 301 is formed over the first nanowires 203 to protect the first nanowires 203 from subsequent process steps. In some embodiments, the second mask layer 301 may be formed using similar material and methods as the first mask layer 201 and the description is not repeated herein.

In some embodiments, the second nanowires 303 may be formed of similar candidate materials (such as III-V compound semiconductor materials) as the first nanowires 203 and the description is not repeated herein. As illustrated in FIG. 3, shapes of the second nanowires 303 are similar to those of the first nanowires 203 and the description is not repeated herein. In some embodiments, the first nanowires 203 and the second nanowires 303 are formed of a same material. In other embodiments, the first nanowires 203 and the second nanowires 303 are formed of different materials.

Referring further to FIG. 3, in the illustrated embodiment, the second nanowires 303 are formed using similar methods (such as the selective-area MOCVD) as the first nanowires 203 and the description is not repeated herein. In some embodiments, a growth temperature of the second nanowires 303 and a V/III precursor ratio is tuned such that the second nanowires 303 are formed having the second lateral dimension $D_2$. In the illustrated embodiment, a single second nanowire 303 is formed in the opening 105d, two second nanowires 303 are formed in the opening 105e, and three second nanowires 303 are formed in the opening 105f. In some embodiments, the second lateral dimension $D_2$ is larger than the first lateral dimension $D_1$. In other embodiments, the second lateral dimension $D_2$ may be less than or equal to the first lateral dimension $D_1$. In some embodiments, the second lateral dimension $D_2$ is between about 5 nm and about 80 nm.

Figure 4:
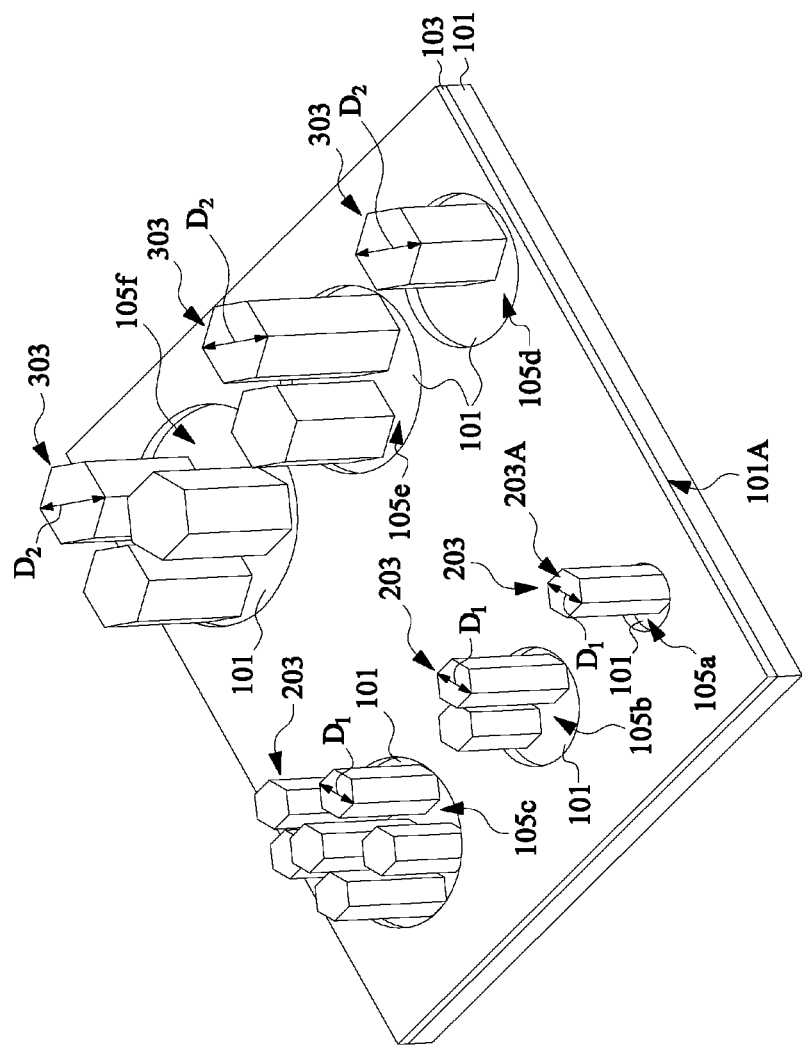

Referring to FIG. 4, the second mask layer 301 may be removed to expose the first nanowires 203. In some embodiments, the second mask layer 301 may be selectively removed using a suitable etch process. Further processing step may be performed on the nanowires (such as the first nanowires 203 and the second nanowires 303) to form devices such as, for example, FET device. As described below in greater detail, the nanowires may be configured to act as channels for the subsequently formed FET devices.

Figure 5:
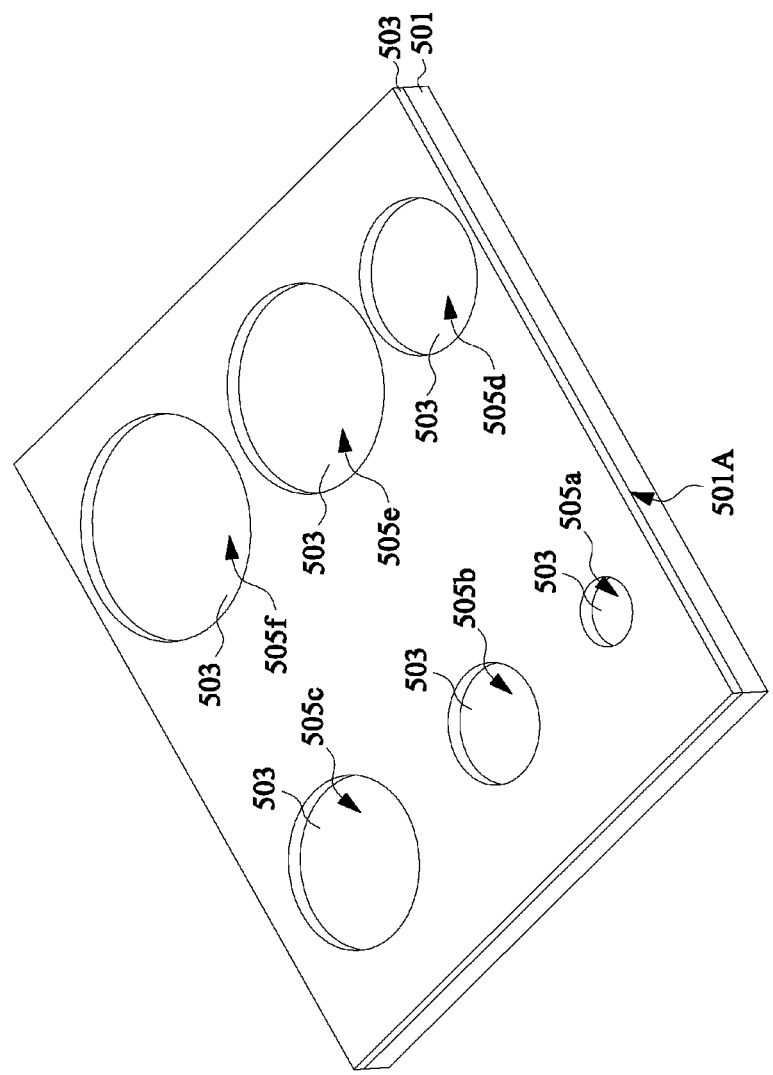
FIGS. 5 through 8 illustrate perspective views of intermediate stages in the formation of nanowires in accordance with some alternative embodiments.

FIGS. 5 through 8 illustrate perspective views of intermediate stages in the formation of nanowires in accordance with some alternative embodiments. Referring first to FIG. 5, a template layer 503 is formed over a substrate 501. In some embodiments, the substrate 501 is similar to the substrate 101 and the description is not repeated herein. In some embodiments, the template layer 503 may comprise a conductive oxide material. Exemplary conductive oxide materials include, and are not limited to, indium tin oxide, zinc oxide, titanium oxide, and the like. In some embodiments, the template layer 503 may be formed using, for example, CVD, PECVD, LPCVD, and the like. As described below in greater detail, nanowires are grown over the template layer 503 (see, for example, FIG. 8), and portions of the template layer 503 below the nanowires may act as source/drain regions for subsequently formed devices, such as FET devices.

The template layer 503 is patterned to form recesses 505a-505f in the template layer 503 such that the substrate 501 in not exposed through the recesses 505a-505f. In some embodiments, the template layer 503 may be patterned using similar method as the template layer 103 and the description is not repeated herein. In the illustrated embodiment, top-view shapes of the recesses 505a-505f are circles. However, in other embodiments, the top-view shapes of the recesses 505a-505f may be polygons such as triangles, rectangles, hexagons, or the like. In some embodiments, lateral dimensions of the recesses 505a-505f may be between about 20 nm and about 400 nm. In the illustrated embodiment, the recesses 505a-505f have different lateral dimensions and are formed in an irregular manner in the template layer 503. In other embodiments, the recesses 505a-505f may have same lateral dimensions and may form as a regular array of recesses in the template layer 503. One having ordinary skill in the art would appreciate that locations, lateral dimensions, and a number of the recesses 505a-505f may vary according to design requirements.

As described below in greater detail, first nanowires 603 and second nanowires 703 (see, for example, FIG. 8) are formed on the template layer 503 in the recesses 505a-505f. Since the substrate 501 is not exposed, effects of the substrate 501 on a growth of the nanowires may be reduced or eliminated. As such, vertical nanowires may be grown on the substrate 501 having a top surface 501A of any orientation (for example, a (100) substrate or a (111) substrate). In some embodiments, the substrate 501 is a (100) substrate.

As described below in greater detail, nanowires will be formed in the recesses 505a-505f. The size of the recesses 505a-505f is used to control the number and/or the size of the nanowires. Accordingly, the template layer 503 is patterned according to the desired location and the desired size of the subsequently formed nanowires. Furthermore, as described below in greater detail, the size of the nanowires is further controlled by process conditions. Accordingly, some of the recesses 505a-505f may be masked and the process conditions altered to grow the nanowires of different sizes in different recesses 505a-505f. As such, nanowires of various sizes may be formed on the substrate 501 based on design requirements for the devices to be formed on the substrate 501.

Figure 6:
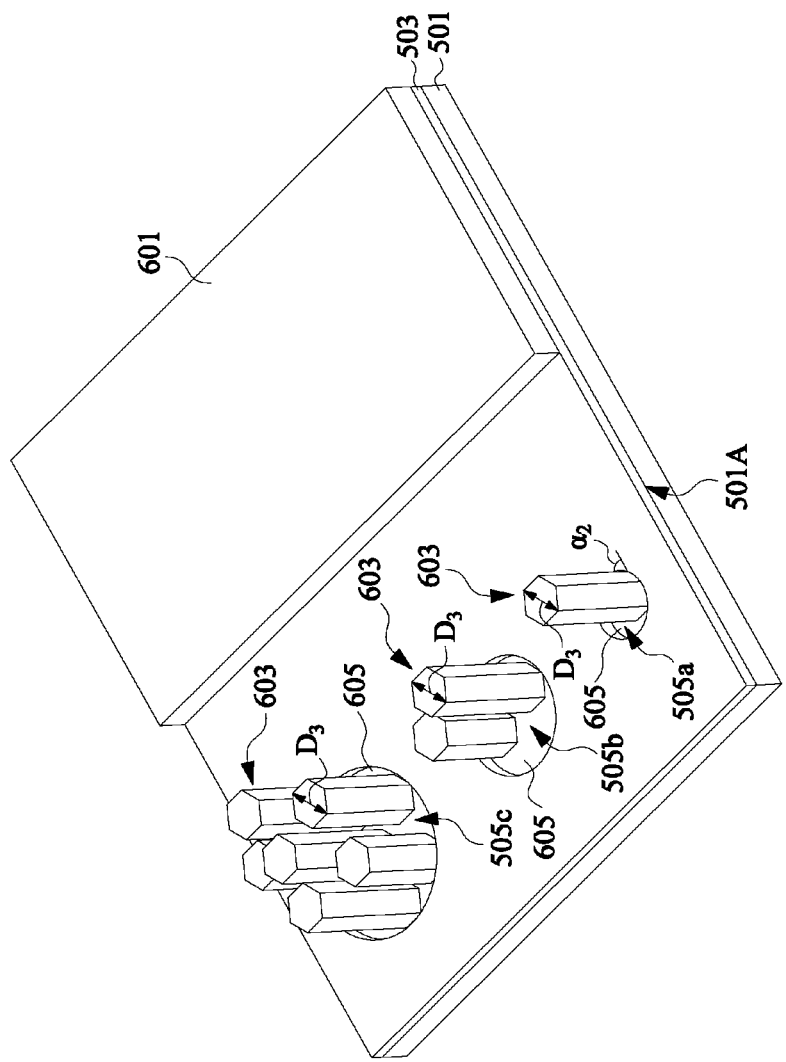

Referring to FIG. 6, a first mask layer 601 is formed over the template layer 503 to protect the recesses 505d-505f from further processing steps. In some embodiments, the first mask layer 601 is formed using similar materials and methods as the first mask layer 201 and the description is not repeated herein.

Referring further to FIG. 6, the first nanowires 603 are formed on the template layer 503 in the recesses 505a-505d. In some embodiments, the first nanowires 603 may be formed of similar candidate materials (such as III-V compound semiconductor materials) as the first nanowires 203 and the description is not repeated herein. As illustrated in FIG. 6, shapes of the first nanowires 603 are similar to those of the first nanowires 203 and the description is not repeated herein. In some embodiments, the first nanowires 603 are epitaxially grown using a selective-area MOCVD.

After forming the first mask layer 601 over the template layer 503, the substrate 501 is transferred into a MOCVD chamber. Subsequently, seed layers 605 of a III-V compound semiconductor material are formed on bottom surfaces of the recesses 505a-505d. The seed layers 605 of the III-V compound semiconductor material advantageously allow formation of nanowires (such as the first nanowires 603) in the recesses 505a-505d. In some embodiments a group III precursor is introduced into the MOCVD chamber to form layers of a group III material (not shown) on bottom surfaces of the recesses 505a-505d. In some embodiments, the layers of the group III material comprise one or few monolayers of the group III material.

In some embodiments when the first nanowires 603 comprise InAs, the group III precursor, such as trimethyl indium (TMIn), is introduced into the MOCVD chamber. The group III precursor may be introduced at a flow rate of from about 10 sccm to about 100 sccm. The group III precursor may be introduced for a duration of about 1 second to about 100 seconds.

After forming the layers of the group III material on the bottom surfaces of the recesses 505a-505d, a group V precursor, such as tributyl arsenic (TBA) or arsine ($AsH_3$), are introduced into the MOCVD chamber to form the seed layers 605 of the III-V compound semiconductor material. In some embodiments, the group V precursor may be introduced at a flow rate of about 20 sccm to about 500 sccm. In some embodiments, the layers of the group III material are completely consumed while forming the seed layers 605 of the of the III-V compound semiconductor material. In other embodiments, the layers of the group III material are partially consumed such that the seed layers 605 of the III-V compound semiconductor material are formed atop unconsumed layers of the group III material.

After forming the seed layers 605 of the III-V compound semiconductor material, the substrate 501 is heated to a temperature between about 540° C. and about 580° C. to promote vertical growth (along the <111>B) rather than radial growth (along <−110> directions) of the first nanowires 603. Subsequently, the group III precursor, such as trimethyl indium (TMIn), is introduced in the MOCVD chamber to start a growth process of the first nanowires 603. In some embodiments, a flow rate of the group III precursor, such as trimethyl indium (TMIn), is between about 300 sccm and 1000 sccm. In some embodiments, a growth duration is between about 1 s and 50 s, which allows for the first nanowires 603 having lengths between about 50 nm and 5 μm. In some embodiments, to further minimize radial growth of the first nanowires 603, a low V/III precursor ratio (the flow rate ratio of the group V precursor to group III precursor) may be used. For example, when the precursors include $AsH_3$ and TMIn, the $AsH_3$/TMI ratio may be between about 1 and about 20. Accordingly, by controlling the temperature of the substrate 501 and the V/III precursor ratio, a first lateral dimension $D_3$ of the first nanowires 603 can be also controlled. In some embodiments, after forming the first nanowires 603, the substrate 501 is cooled to a temperature about 300° C. under a flow of the Group V precursor. In some embodiments, the first lateral dimension $D_3$ is between about 5 nm and about 80 nm.

Through the adjustment of selective-area MOCVD process conditions, the first nanowires 603 grow vertically without expanding laterally. Accordingly, top portions, bottom portions, and intermediate portions of the first nanowires 603 have the same first lateral dimensions $D_3$ and shapes. The sidewalls of the first nanowires 603 are perpendicular to or substantially perpendicular to the top surface 501A of substrate 501, for example, with a tilt angle $\alpha_2$ being about 90°.

In the illustrated embodiment, a single first nanowire 603 is formed in the recess 505a, two first nanowires 603 are formed in the recess 505b, and six first nanowires 603 are formed in the recess 505c. Depending on the first lateral dimension $D_3$ of the first nanowires 603 and the lateral dimensions of the recesses 505a-505c, the recesses 505a-505c may accommodate various numbers of the first nanowires 603.

Figure 7:
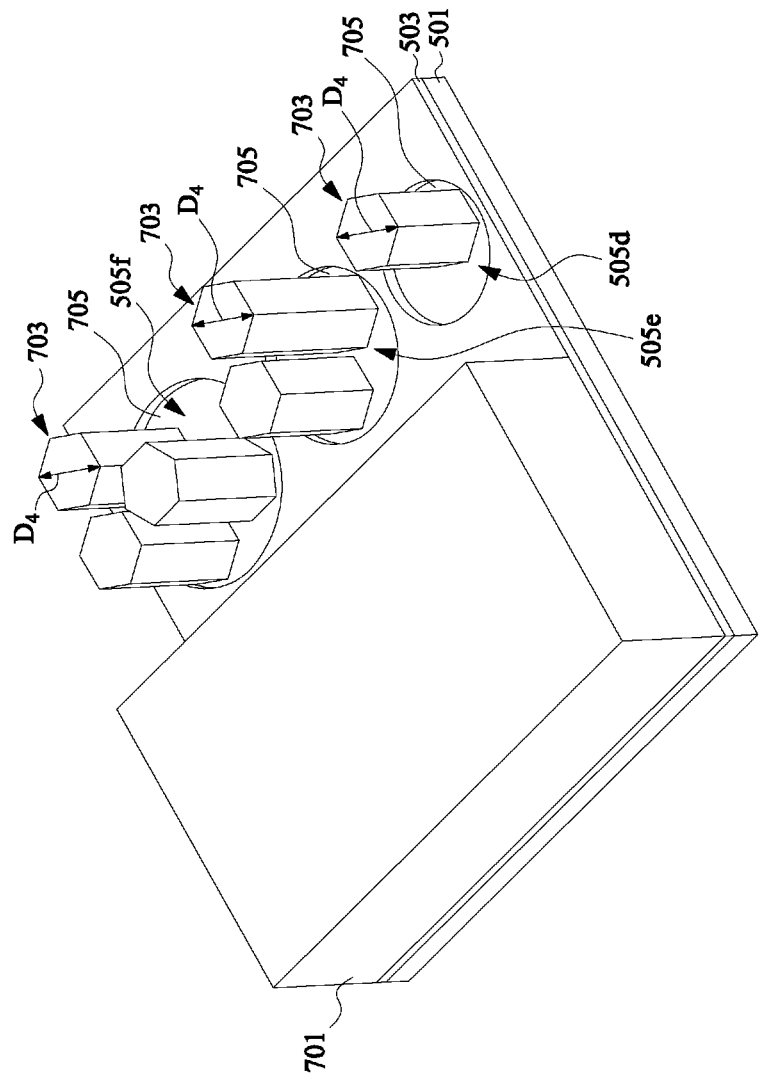

Referring to FIG. 7, second nanowires 703 are formed over the substrate 501 in the recesses 505d-505f. After forming the first nanowires 603, the first mask layer 601 is removed to expose the recesses 505d-505f. In some embodiments, the first mask layer 601 may be selectively removed using a suitable etch process. Subsequently, a second mask layer 701 is formed over the first nanowires 603 to protect the first nanowires 603 from subsequent process steps. In some embodiments, the second mask layer 701 may be formed using similar material and methods as the first mask layer 601 and the description is not repeated herein.

Referring further to FIG. 7, seed layers 705 are formed in the recesses 505d-505f of the template layer 503 and the second nanowires 703 are formed on the seed layers 705. In some embodiments, the seed layers 705 may be formed using similar materials and methods as the seed layers 605 and the description is not repeated herein. In some embodiments, the second nanowires 703 may be formed of similar candidate materials (such as III-V compound semiconductor materials) as the first nanowires 603 and the description is not repeated herein. As illustrated in FIG. 7, shapes of the second nanowires 703 are similar to those of the first nanowires 603 and the description is not repeated herein. In some embodiments, the first nanowires 603 and the second nanowires 703 are formed of a same material. In other embodiments, the first nanowires 603 and the second nanowires 703 are formed of different materials.

Referring further to FIG. 7, in the illustrated embodiment, the second nanowires 703 are formed using similar methods (such as the selective-area MOCVD) as the first nanowires 603 and the description is not repeated herein. In some embodiments, the growth temperature of the second nanowires 703 and the V/III precursor ratio is tuned such that the second nanowires 703 are formed having a second lateral dimension $D_4$. In the illustrated embodiment, a single second nanowire 703 is formed in the recess 505d, two second nanowires 703 are formed in the recess 505e, and three second nanowires 703 are formed in the recess 505f. In some embodiments, the second lateral dimension $D_4$ is larger than the first lateral dimension $D_3$. In other embodiments, the second lateral dimension $D_4$ may be less than or equal to the first lateral dimension $D_3$. In some embodiments, the second lateral dimension $D_4$ is between about 5 nm and about 80 nm.

Figure 8:
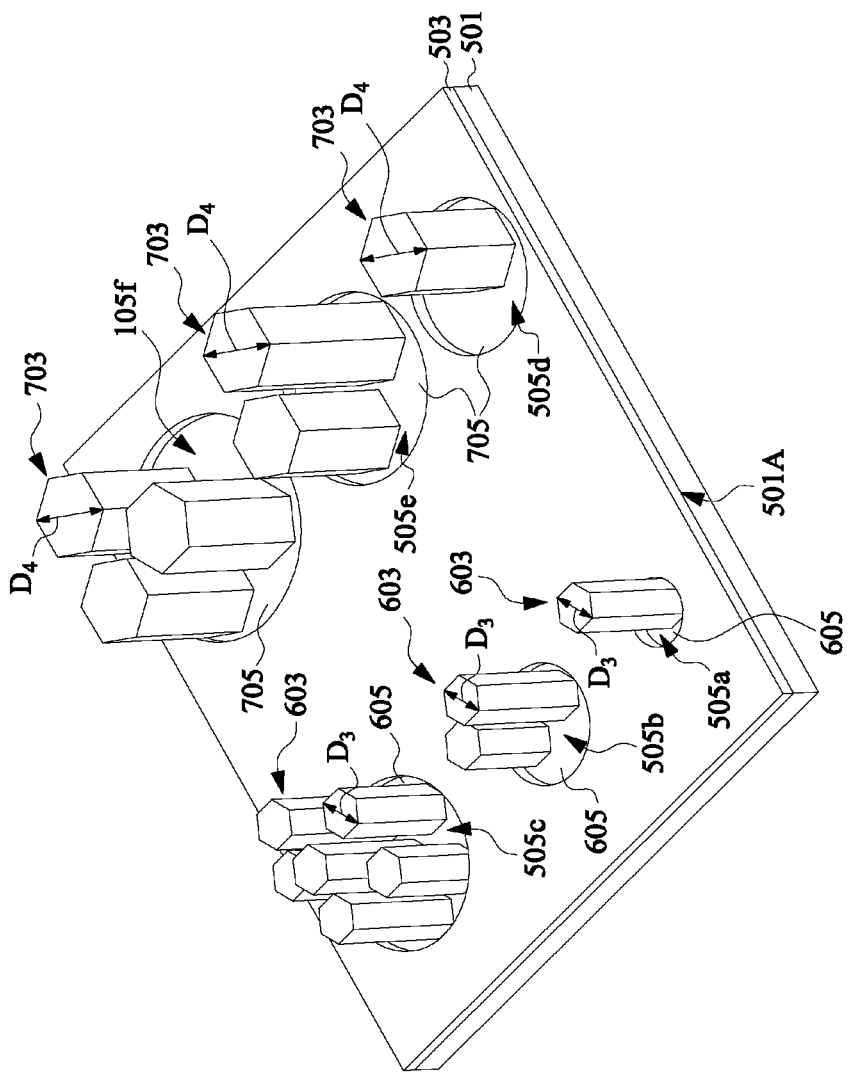

Referring to FIG. 8, the second mask layer 701 may be removed to expose the first nanowires 603. In some embodiments, the second mask layer 701 may be selectively removed using a suitable etch process. Further processing step may be performed on the nanowires (such as the first nanowires 603 and the second nanowires 703) to form semiconductor devices such as, for example, FET device. As described below in greater detail, the nanowires may be configured to act as channels for the subsequently formed FET devices.

FIGS. 9A-16B illustrate various intermediate stages of fabrication of a semiconductor device 900 using nanowires formed by the method described above with reference to FIGS. 1-4 in accordance with some embodiments. FIGS. 9A-16B illustrate top and cross-sectional views, wherein an "A" figure represents a top view and a "B" figure represents a cross-sectional view along the B-B' line of the respective "A" figure. In addition, various elements of FIGS. 9A-16A are depicted using dashed lines to indicate that such elements are not visible in the top views illustrated in FIGS. 9A-16A.

Figure 9A:
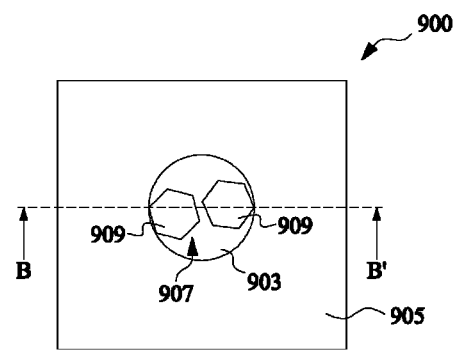
Figure 9B:
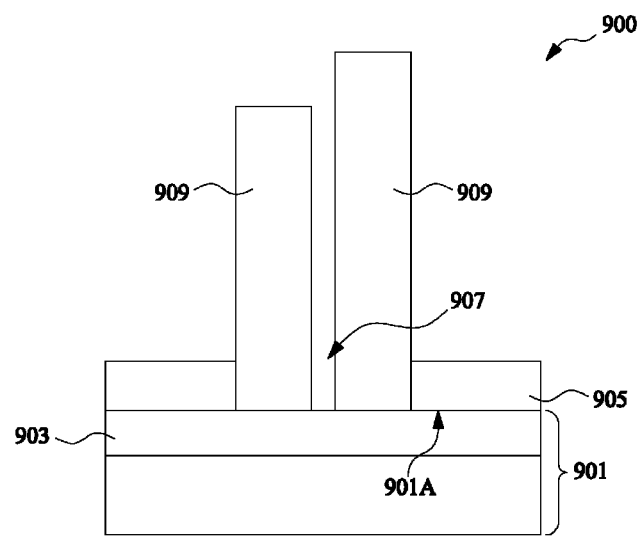

Referring first to FIGS. 9A and 9B, the semiconductor device 900 comprises a substrate 901. In some embodiments, the substrate 901 comprises similar material as the substrate 101 and the description is not repeated herein. In the illustrated embodiment, the substrate 901 is a (111) substrate. In some embodiments, a doped region 903 is formed in the substrate 901, for example, through implantation, diffusion, or the like. The doped region 903 may be doped with p-type impurities (such as boron or indium) or n-type impurities (such as phosphorous, arsenic, or antimony). As described below in greater detail, the doped region 903 may act as a source/drain region of the semiconductor device 900 and may be also referred to as a first source/drain region 903.

Referring further to FIGS. 9A and 9B, a template layer 905 is formed on a top surface 901A of the substrate 901 and is patterned to form an opening 907 in the template layer 905. In some embodiments, the template layer 905 may be formed using similar materials and methods as the template layer 103 and the description is not repeated herein. The opening 907 in the template layer 905 may be formed using similar methods as the openings 105a-105d in the template layer 103 and the description is not repeated herein. In the illustrated embodiment, a top-view shape of the opening 907 is a circle. However, in other embodiments, the top-view shape of the opening 907 may be a polygon such as a triangle, a rectangle, a hexagon, or the like.

In some embodiments, nanowires 909 comprising a III-V compound semiconductor material are formed on the substrate 901 in the opening 907 using the selective-area MOCVD as described above with reference to FIGS. 1-4 and the description is not repeated herein. In the illustrated embodiment, two nanowires 909 are formed on the substrate 901. However, in other embodiments, the number of the nanowires 909 may be less or more than two depending on design requirements of the semiconductor device 900. As described below in greater detail, the nanowires 909 are configured to act as channels of the semiconductor device 900. Accordingly, the semiconductor device 900 may have one or multiple channels.

Figure 10A:
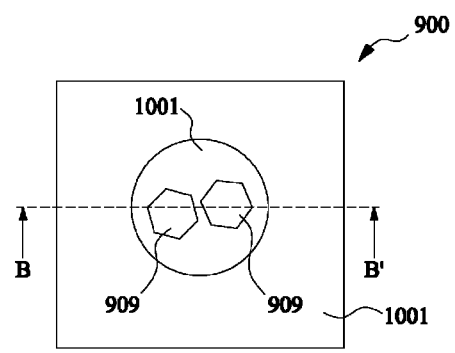
Figure 10B:
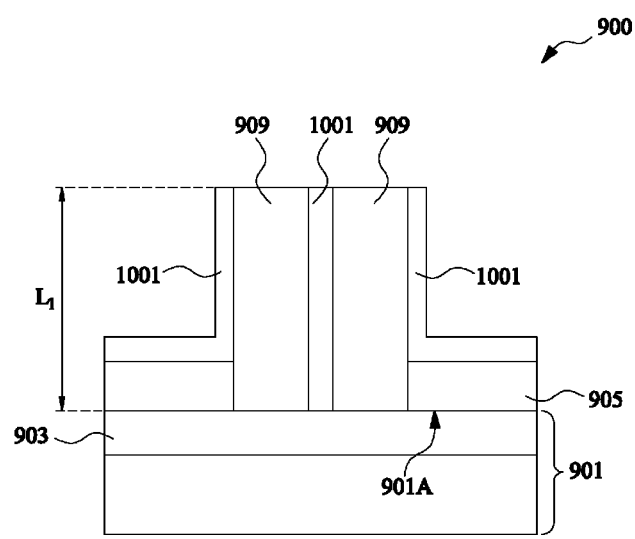

Referring to FIGS. 10A and 10B, a gate dielectric 1001 is formed over and surrounding the nanowires 909. In some embodiments, the gate dielectric 1001 comprises one or more layers of high-k dielectric materials. Generally, a high-k dielectric material has a dielectric constant (k-value) higher than 3.9. For example, the gate dielectric 1001 may include one or more layers of a metal oxide or a silicate of Hf, Al, Zr, combinations thereof, and multi-layers thereof. Other suitable materials include La, Mg, Ba, Ti, Pb in the form of metal oxides, metal alloyed oxides, or combinations thereof. In some embodiments, the gate dielectric 1001 may be formed using atomic layer deposition (ALD), CVD, PECVD, molecular-beam deposition (MBD), or the like.

Subsequently, the gate dielectric 1001 and the nanowires 909 are planarized such that top surfaces of the nanowires 909 are substantially coplanar with a topmost surface of the gate dielectric 1001. In some embodiments, the planarization process may include, for example, a mechanical grinding process, a chemical mechanical polishing (CMP) process, an etching process, the like, or a combination thereof. Accordingly, each of the nanowires 909 has a same length $L_1$ between about 2 nm and about 5 μm.

Figure 11A:
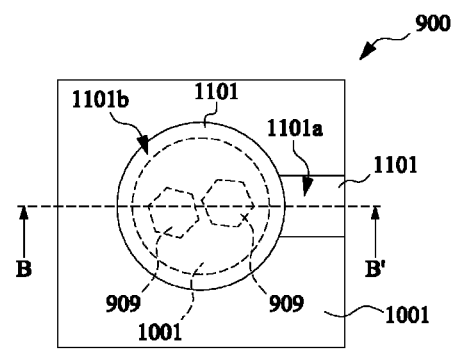
Figure 11B:
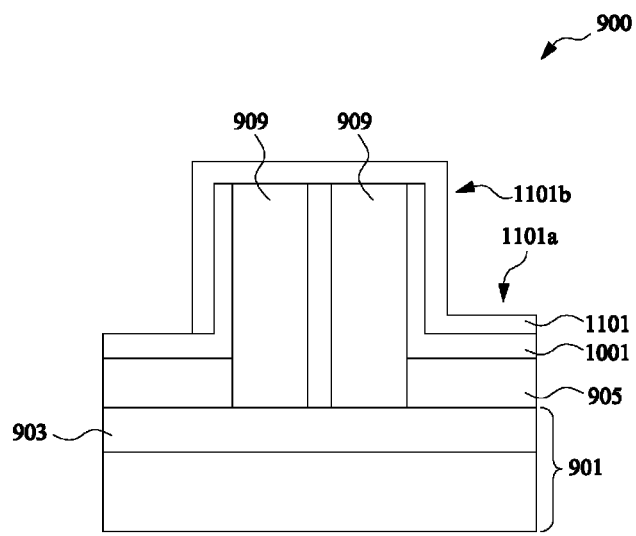

Referring to FIGS. 11A and 11B, a gate electrode 1101 is formed adjacent the gate dielectric 1001. In some embodiments, the gate electrode 1101 may comprise a metallic material such as gold, silver, aluminum, copper, tungsten, molybdenum, nickel, titanium, or alloys thereof, and may be formed using physical vapor deposition (PVD), ALD, or the like. In some embodiments, the metallic material is patterned such that the gate electrode 1101 comprises a first portion 1101a laterally extending over the gate dielectric 1001, and a second portion 1101b surrounding the nanowires 909. As described below in greater detail, the first portion 1101a of the gate electrode 1101 acts as a contact pad for a subsequently formed conductive plug that provides electrical connection to the gate electrode 1101. The gate dielectric 1001 and the gate electrode 1101 form a gate stack surrounding the nanowires 909, which act as channels of the semiconductor device 900.

Figure 12A:
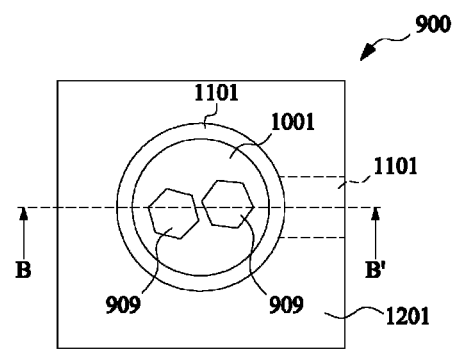
Figure 12B:
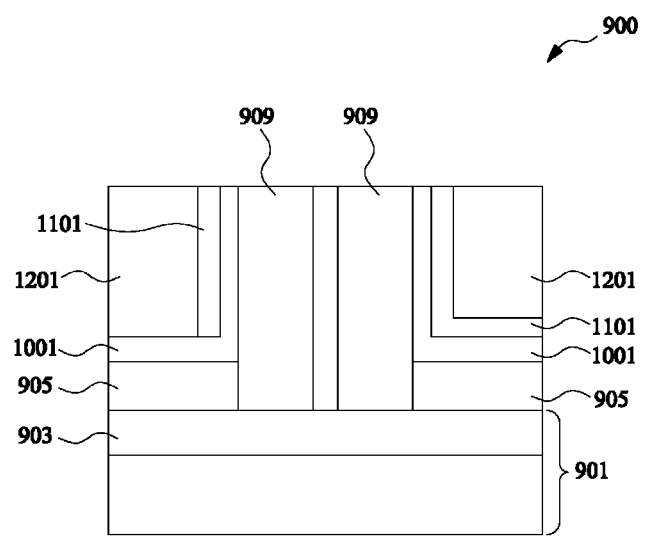

Referring to FIGS. 12A and 12B, a first interlayer dielectric (ILD) layer 1201 is formed over the nanowires 909, the gate dielectric 1001 and the gate electrode 1101. In some embodiments, the first ILD layer 1201 is formed of one or more layers of a dielectric material, such as silicon oxide, low-k dielectrics or other suitable materials, by a suitable technique, such as CVD, ALD, spin-on, or the like. In some embodiments, portions of the first the first ILD layer 1201 and the gate electrode 1101 extending above the nanowires 909 are removed such that the topmost surfaces of the nanowires 909 are substantially coplanar with topmost surfaces of the gate electrode 1101 and the first ILD layer 1201. In some embodiments, the portions of the first the first ILD layer 1201 and the gate electrode 1101 may be removed using, for example, a CMP process, an etching process, the like, or a combination thereof.

Figure 13A:
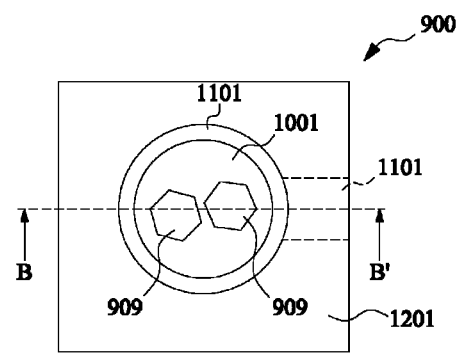
Figure 13B:
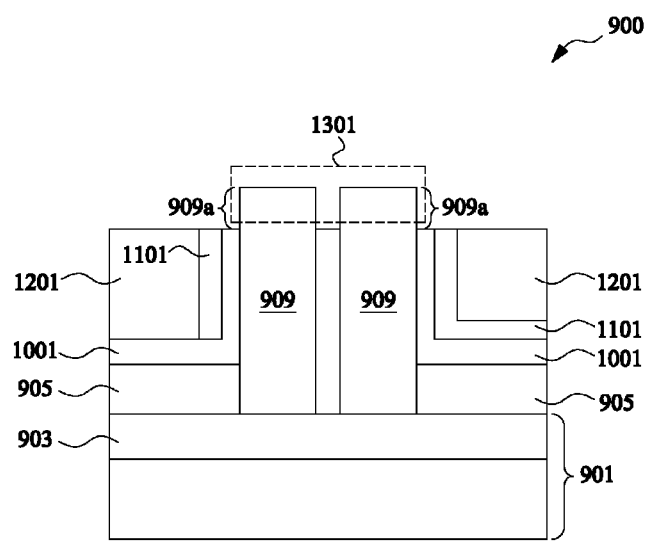

Referring to FIGS. 13A and 13B, the first ILD layer 1201, the gate electrode 1101 and the gate dielectric 1001 are recessed to expose portions 909a of the nanowires 909. As described below, the recessing process allows to electrically isolate the gate electrode 1101 from a subsequently formed source/drain contact (see FIGS. 16A and 16B). In some embodiments, the first ILD layer 1201, the gate electrode 1101 and the gate dielectric 1001 are recessed using, for example, one or more suitable etch processes. In some embodiments, the portions 909a of the nanowires 909 may be optionally doped to form a second source/drain region 1301 comprising the doped portions 909a of the nanowires 909. In some embodiments, the nanowires 909 may be doped in situ during growing of the nanowires 909 by introducing a suitable gas to the MOCVD chamber depending on doping type. In some embodiments wherein the nanowires 909 are formed of InAs, the nanowires 909 may be n-doped with silicon (Si) using a silicon precursor such as, for example, monosilane ($SiH_4$) gas. In other embodiments, the nanowires 909 may be doped using suitable dopants after exposing the portions of the nanowires 909 using, for example, an ion implantation method, or the like.

Figure 14A:
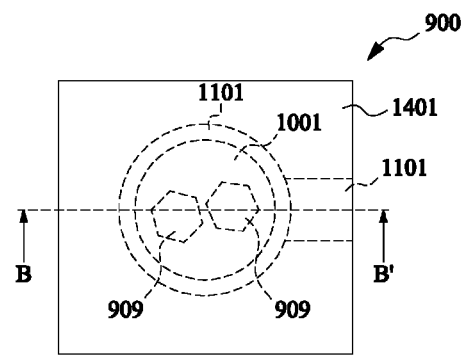
Figure 14B:
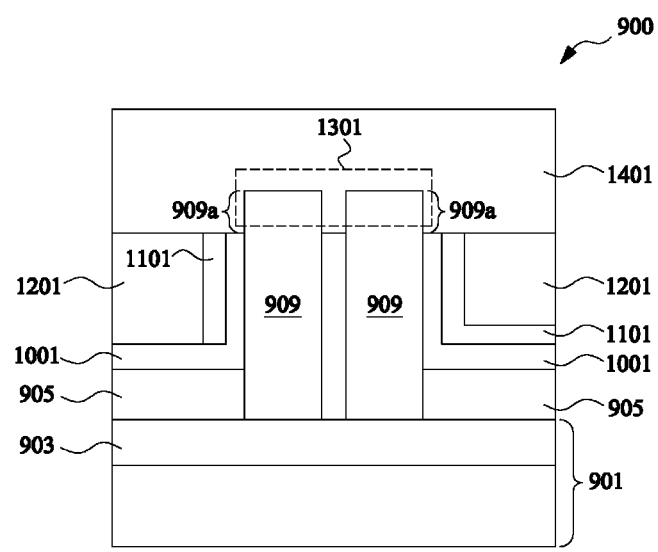

Referring to FIGS. 14A and 14B, a second ILD layer 1401 is formed over the first ILD layer 1201, and over and surrounding the nanowires 909. In some embodiment, the second ILD layer 1401 may be formed using same materials and methods as the first ILD layer 1201 and the description is not repeated herein. In some embodiments, the first ILD layer 1201 and the second ILD layer 1401 may be formed of a same material. In other embodiments, the first ILD layer 1201 and the second ILD layer 1401 may be formed of different materials. In some embodiments, the second ILD layer 1401 is planarized using, for example, a CMP process, or the like.

Figure 15A:
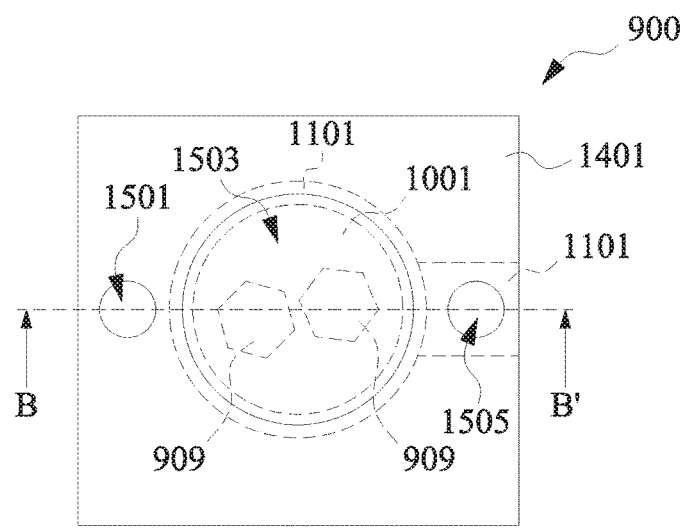
Figure 15B:
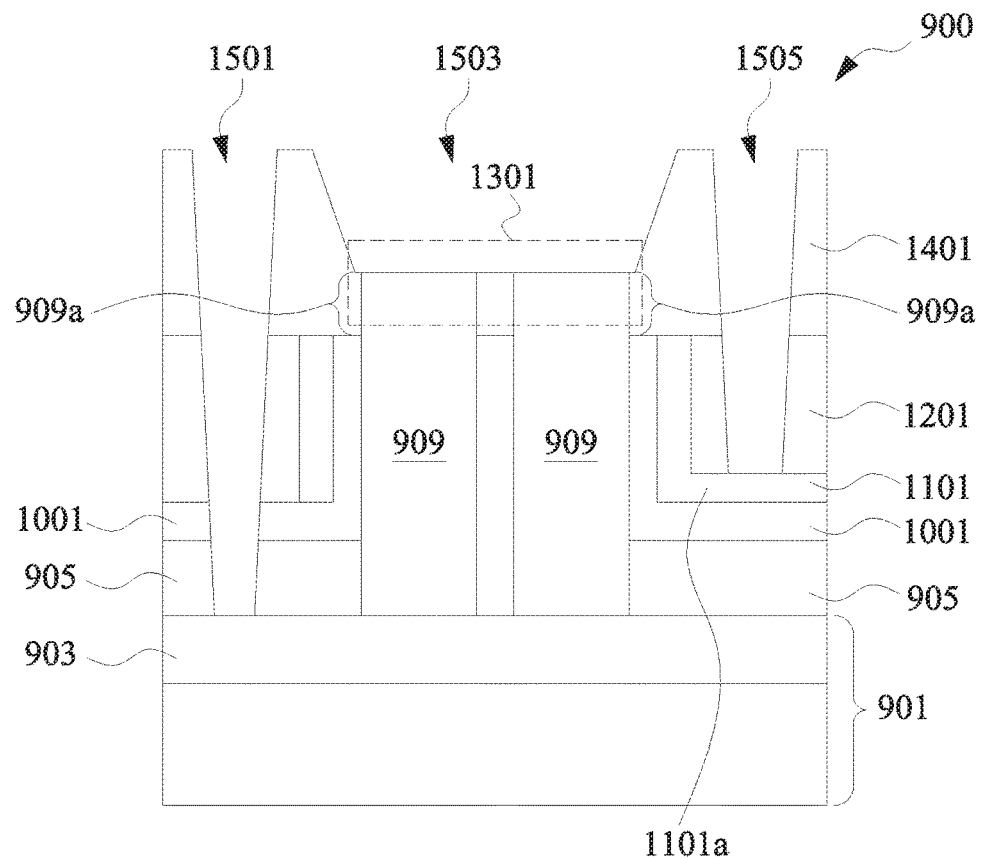

Referring to FIGS. 15A-16B, contact plugs are formed to provide electrical connections to the first source/drain region 903, the second source/drain region 1301, and the gate electrode 1101. Turning first to FIGS. 15A and 15B, a first opening 1501, a second opening 1503, and a third opening 1505 are formed from a top surface of the second ILD layer 1401. In some embodiment, the first opening 1501, the second opening 1503, and the third opening 1505 are formed using suitable lithography and etching processes. In the illustrated embodiment, the first opening 1501 extends through the second ILD layer 1401, the first ILD layer 1201, the gate dielectric 1001 and the template layer 905, and exposes the first source/drain region 903. The second opening 1503 extends through the second ILD layer 1401 and exposes the portion 909a of the nanowires 909 and, hence, exposes the second source/drain region 1301. The third opening 1505 extends through the second ILD layer 1401 and the first ILD layer 1201, and exposes the first portion 1101a of the gate electrode 1101.

Figure 16A:
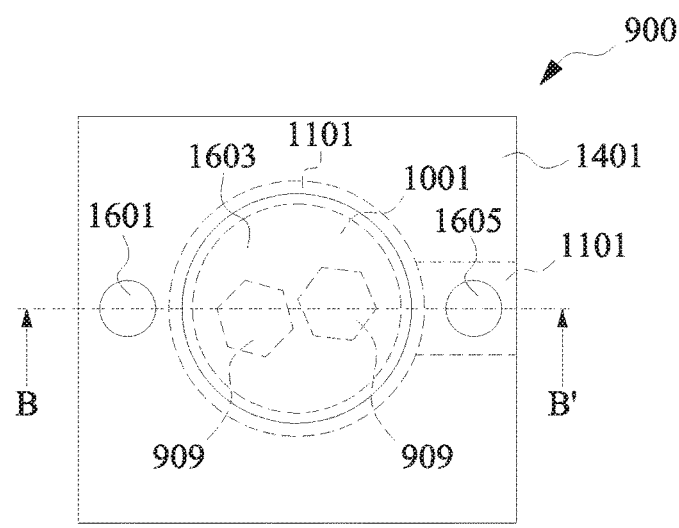
Figure 16B:
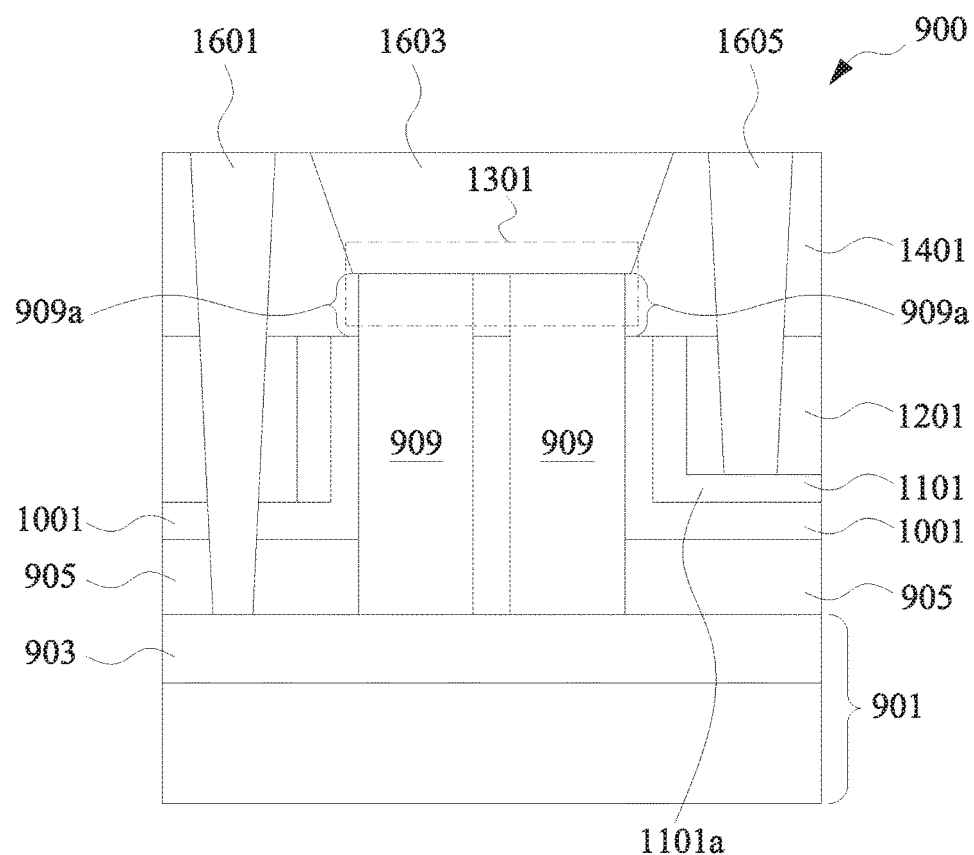

Referring next to FIGS. 16A and 16B, a first contact plug 1601, a second contact plug 1603, and a third contact plug 1605 are formed in the first opening 1501, the second opening 1503, and the third opening 1505, respectively. In some embodiments, one or more barrier/adhesion layers (not shown) are conformally formed in the first opening 1501, the second opening 1503, and the third opening 1505. The one or more barrier/adhesion layers protect neighboring layers (such as, for example, the first ILD layer 1201 and the second ILD layer 1401) from metallic diffusion. The one or more barrier/adhesion layers may comprise titanium, titanium nitride, tantalum, tantalum nitride, or the like and may be formed using PVD, CVD, ALD, the like, or a combination thereof. In some embodiments, a seed layer (not shown) is conformally formed over the one or more barrier/adhesion layers. The seed layer may comprise copper, titanium, nickel, gold, manganese, the like, or a combination thereof, and may be formed by ALD, PVD, the like, or a combination thereof.

Referring further to FIGS. 16A and 16B, the first contact plug 1601, the second contact plug 1603, and the third contact plug 1605 are formed by filling the first opening 1501, the second opening 1503, and the third opening 1505, respectively, with a suitable conductive material. In some embodiments, the first contact plug 1601, the second contact plug 1603, and the third contact plug 1605 may comprise copper, a copper alloy, silver, gold, tungsten, tantalum, aluminum, and the like, and may be formed using an electro-chemical plating process, an electroless plating process, ALD, PVD, the like, or a combination thereof.

In some embodiments, excess materials overfilling the first opening 1501, the second opening 1503, and the third opening 1505 are removed such that the topmost surfaces of the first contact plug 1601, the second contact plug 1603, and the third contact plug 1605 are substantially coplanar with the topmost surface of the second ILD layer 1401. In some embodiments, the excess materials are removed using, for example, a mechanical grinding process, a CMP process, an etching process, the like, or a combination thereof.

Referring further to FIGS. 16A and 16B, in the illustrated embodiment, top-view shapes of the first contact plug 1601, the second contact plug 1603, and the third contact plug 1605 are circles. However, in other embodiments, the top-view shapes of the first contact plug 1601, the second contact plug 1603, and the third contact plug 1605 may be polygons such as triangles, rectangles, hexagons, or the like. Furthermore, locations of the first contact plug 1601, the second contact plug 1603, and the third contact plug 1605, as shown in FIGS. 16A and 16B, are provided as examples and are not limiting. In other embodiments, the first contact plug 1601, the second contact plug 1603, and the third contact plug 1605 may be formed at other locations based on design requirements for the semiconductor device 900.

In some embodiments, further manufacturing steps may be performed on the semiconductor device 900. For example, metallization layers (not shown) may be formed over the second ILD layer 1401. The metallization layers may comprise one or more dielectric layers, and one or more conductive features formed in the one or more dielectric layers. In some embodiments, the metallization layers are in electrical contact with the first contact plug 1601, the second contact plug 1603, and the third contact plug 1605, and electrically interconnect the semiconductor device 900 to other devices formed on the substrate 901. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 901 may be singulated into separate dies, which may further undergo various packaging processes.

As illustrated in FIGS. 16A and 16B, the semiconductor device 900 comprises two nanowires 909, which are configured as the channels of the semiconductor device 900. In other embodiments, the number of the nanowires 909 and, thus, of the channels may vary according to design specifications of the semiconductor device 900. In some embodiments where the semiconductor device 900 is configured as a low-power device, the semiconductor device 900 may comprise multiple narrow nanowires, which allows for better gate control while maintaining an ON current $I_{ON}$ sufficient for low-power operations. In other embodiments where the semiconductor device 900 is configured as a high-power device, the semiconductor device 900 may comprise a few wide nanowires, which allows for a high $I_{ON}$ for high-power operations. In some embodiments, the low-power devices comprise more nanowires than the high-power devices, while a lateral dimension of the nanowires of the high-power devices are larger than a lateral dimension of the nanowires of the low-power devices.

Figure 17:
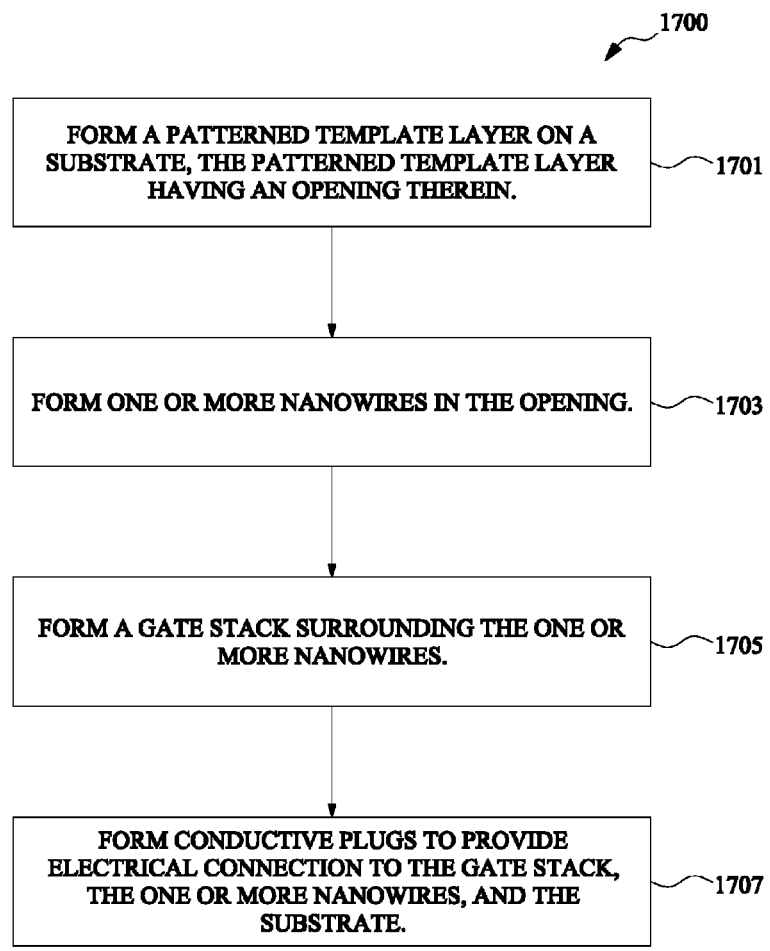
FIG. 17 is a flow diagram illustrating a method of forming a semiconductor device in accordance with some embodiments.

FIG. 17 is a flow diagram illustrating a method 1700 of forming a semiconductor device in accordance with some embodiments. The method 1700 starts at step 1701, wherein a patterned template layer (such as the template layer 905) having an opening (such as the opening 907) therein is formed on a substrate (such as the substrate 901) as described above with reference to FIGS. 9A and 9B. In step 1703, one or more nanowires (such as the nanowires 909) are formed in the opening as described above with reference to FIGS. 9A and 9B. In some embodiments, the nanowires are formed using an epitaxial growth method described above with reference to FIGS. 1-4. In step 1705, a gate stack (such as the gate dielectric 1001 and the gate electrode 1101) is formed surrounding the nanowires as described above with reference to FIGS. 10A-12B. In step 1707, contact plugs (such as the first contact plug 1601, the second contact plug 1603, and the third contact plug 1605) are formed to provide electrical connection to the gate stack, the one or more nanowires and the substrate as described above with reference to FIGS. 13A-16B.

FIGS. 18A-25B illustrate various intermediate stages of fabrication of a semiconductor device 1800 using nanowires formed by the method described above with reference to FIGS. 5-8 in accordance with some embodiments. FIGS. 18A-25B illustrate top and cross-sectional views, wherein an "A" figure represents a top view and a "B" figure represents a cross-sectional view along the B-B' line of the respective "A" figure. In addition, various elements of FIGS. 18A-25A are depicted using dashed lines to indicate that such elements are not visible in the top views illustrated in FIGS. 18A-25A.

Figure 18A:
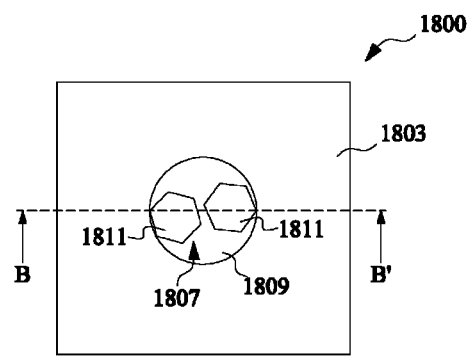
Figure 18B:
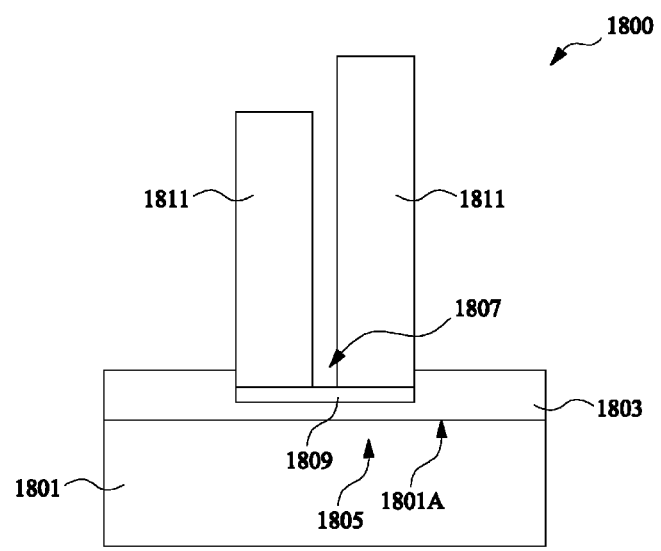

Referring first to FIGS. 18A and 18B, the semiconductor device 1800 comprises the substrate 1801. In some embodiments, the substrate 1801 comprises similar material as the substrate 501 and the description is not repeated herein. In the illustrated embodiment, the substrate 1801 is a (111) substrate or a (100) substrate.

Referring further to FIGS. 18A and 18B, a template layer 1803 is formed on a top surface 1801A of the substrate 1801 and is patterned to form a recess 1807 in the template layer 1803. In some embodiments, the template layer 1803 may be formed using similar materials and methods as the template layer 503 and the description is not repeated herein. The recess 1807 in the template layer 1803 may be formed using similar methods as the recessed 505a-505d in the template layer 503 and the description is not repeated herein. In the illustrated embodiment, a top-view shape of the recess 1807 is a circle. However, in other embodiments, the top-view shape of the recess 1807 may be a polygon such as a triangle, a rectangle, a hexagon, or the like.

In some embodiments, nanowires 1811 comprising a III-V compound semiconductor material are formed on a seed layer 1809 in the recess 1807 using the selective-area MOCVD as described above with reference to FIGS. 5-8 and the description is not repeated herein. In some embodiments, the seed layer 1809 may be formed using same material and methods as the seed layers 605 and the description is not repeated herein. In the illustrated embodiment, two nanowires 1811 are formed on the seed layer 1809 in the recess 1807. However, in other embodiments, the number of the nanowires 1811 may be less or more than two depending on design requirements of the semiconductor device 1800. As described below in greater detail, the nanowires 1811 are configured to act as channels of the semiconductor device 1100. Accordingly, the semiconductor device 1800 may have one or multiple channels. In addition, in some embodiments where the template layer 1803 comprises a conductive oxide material, a portion 1805 of the template layer 1803 disposed below the nanowires 1811 may act as a source/drain region and may be referred to as a first source/drain region 1805.

Figure 19A:
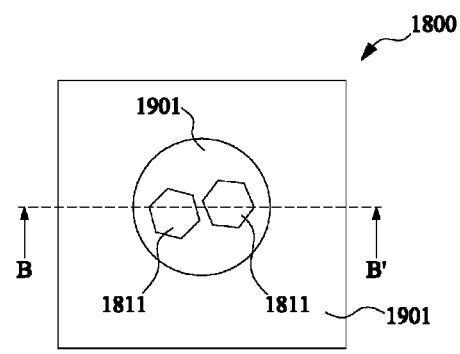
Figure 19B:
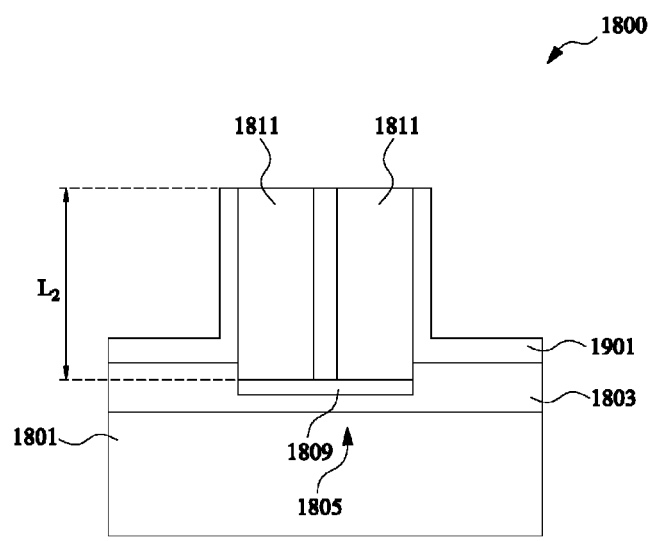

Referring to FIGS. 19A and 19B, a gate dielectric 1901 is formed over and surrounding the nanowires 1811. In some embodiments, the gate dielectric 1901 may be formed using same material and methods as the gate dielectric 1001 and the description is not repeated herein. Subsequently, the gate dielectric 1901 and the nanowires 1811 are planarized such that top surfaces of the nanowires 1811 are substantially coplanar with a topmost surface of the gate dielectric 1901. In some embodiments, the planarization process may include, for example, a mechanical grinding process, a chemical mechanical polishing (CMP) process, an etching process, the like, or a combination thereof. Accordingly, each of the nanowires 1811 has a same length $L_2$ between about 2 nm and about 5 μm.

Figure 20A:
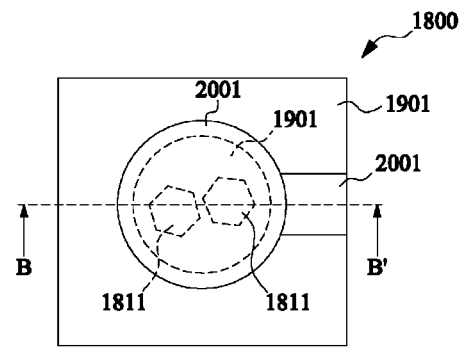
Figure 20B:
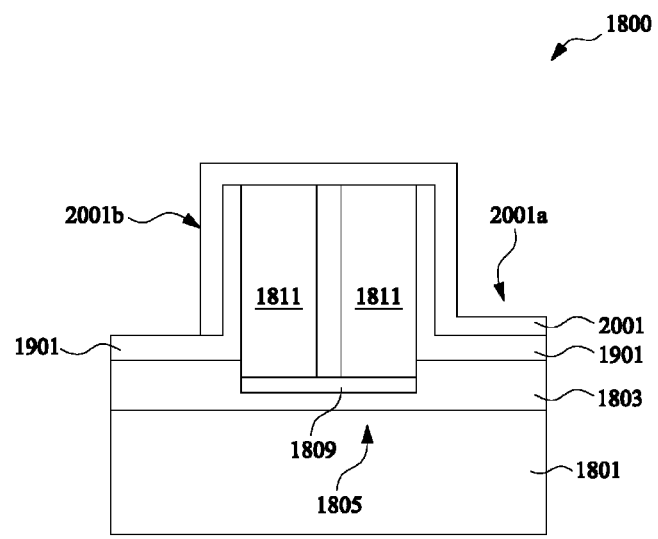

Referring to FIGS. 20A and 20B, a gate electrode 2001 is formed adjacent the gate dielectric 1901. In some embodiments, the gate electrode 2001 may be formed using same materials and methods as the gate electrode 1101 and the description is not repeated herein. In some embodiments, the gate electrode 2001 is pattered similar to the gate electrode 1101 such that the gate electrode 2001 comprises a first portion 2001a laterally extending over the gate dielectric 1901, and a second portion 2001b surrounding the nanowires 1811. As described below in greater detail, the first portion 2001a of the gate electrode 2001 acts as a contact pad for a subsequently formed conductive plug that provides electrical connection to the gate electrode 2001. The gate dielectric 1901 and the gate electrode 2001 form a get stack surrounding the nanowires 1811, which act as channels of the semiconductor device 1800.

Figure 21A:
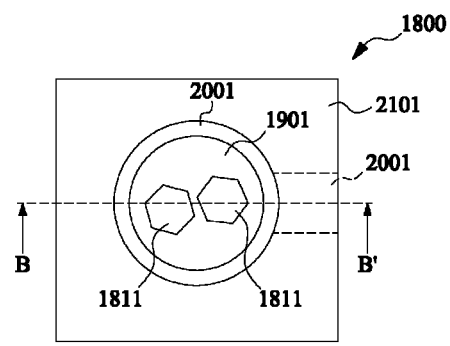
Figure 21B:
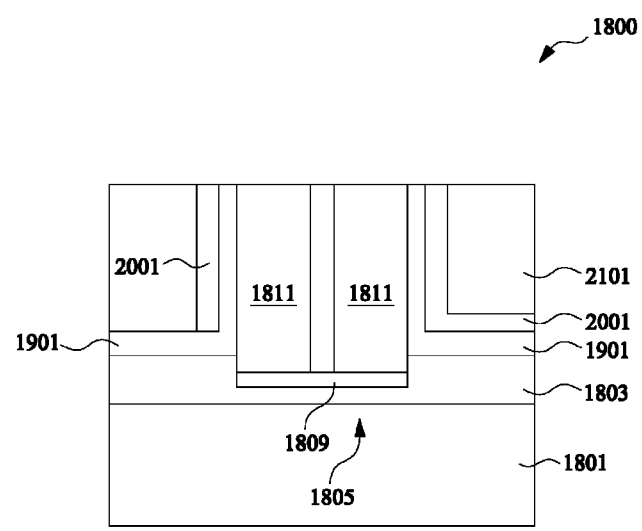

Referring to FIGS. 21A and 21B, a first ILD layer 2101 is formed over the nanowires 1811, the gate dielectric 1901 and the gate electrode 2001, such that the topmost surfaces of the nanowires 1811 are substantially coplanar with topmost surfaces of the gate electrode 2001, the gate dielectric 1901 and the first ILD layer 1201. In some embodiments, the first ILD layer 2101 may be formed using same materials and methods as the first ILD layer 1201 and the description is not repeated herein.

Figure 22A:
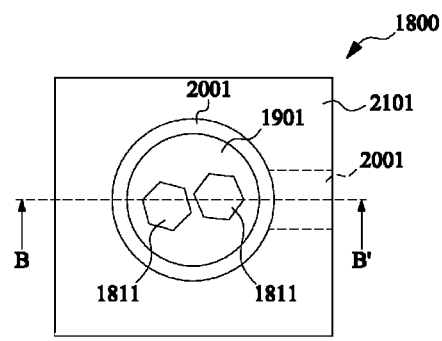
Figure 22B:
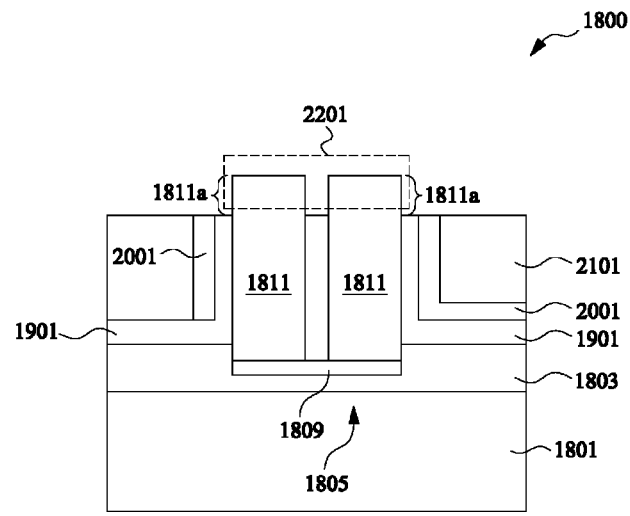

Referring to FIGS. 22A and 22B, the first ILD layer 2101, the gate electrode 2001 and the gate dielectric 1901 are recessed to expose portions 1811a of the nanowires 1811. As described below, the recessing process allows to electrically isolate the gate electrode 2001 from a subsequently formed source/drain contact (see FIGS. 25A and 25B). In some embodiments, the first ILD layer 2101, the gate electrode 2001 and the gate dielectric 1901 using, for example, one or more suitable etch processes. In some embodiments, the portions 1811a of the nanowires 1811 may be optionally doped to form a second source/drain region 2201 comprising the doped portions 1811a of the nanowires 1811. In some embodiments, the nanowires 1811 may be doped using same methods as the nanowires 909 and the description is not repeated herein.

Figure 23A:
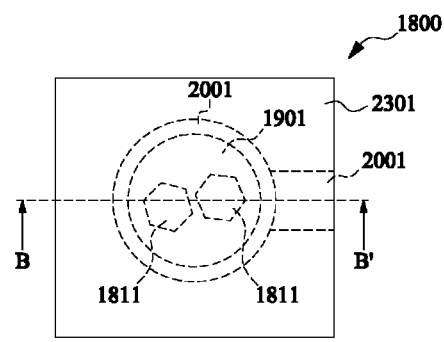
Figure 23B:
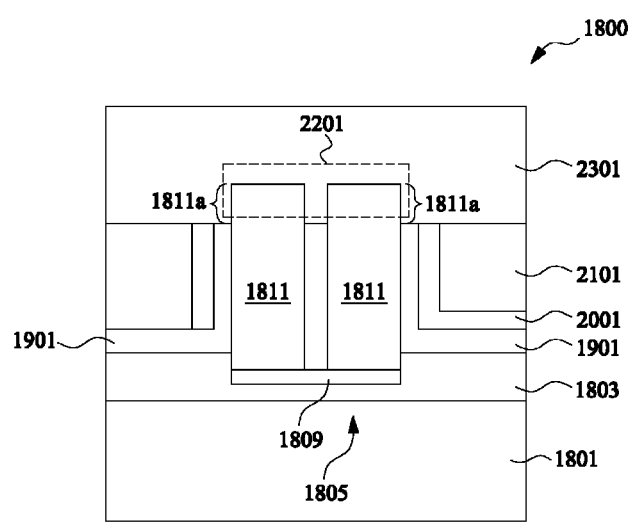

Referring to FIGS. 23A and 23B, a second ILD layer 2301 is formed over the first ILD layer 2101, and over and surrounding the portions 1811a of the nanowires 1811. In some embodiment, the second ILD layer 2301 may be formed using same materials and methods as the first ILD layer 2101 and the description is not repeated herein. In some embodiments, the first ILD layer 2101 and the second ILD layer 2301 may be formed of a same material. In other embodiments, the first ILD layer 2101 and the second ILD layer 2301 may be formed of different materials. In some embodiments, the second ILD layer 2301 is planarized using, for example, a CMP process, or the like.

Figure 24A:
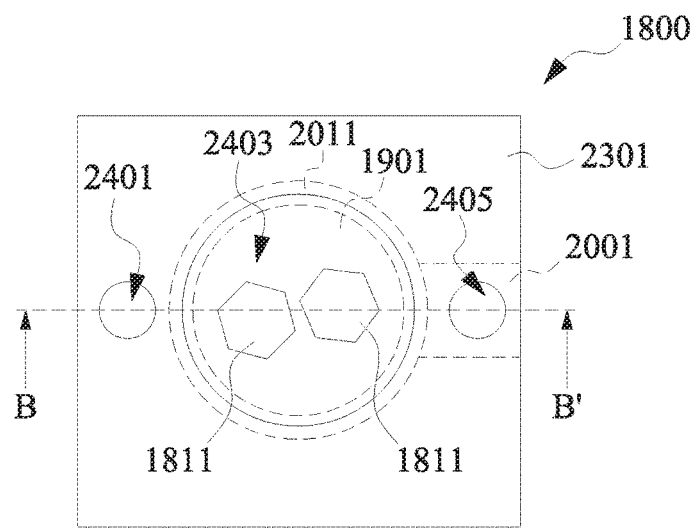
Figure 24B:
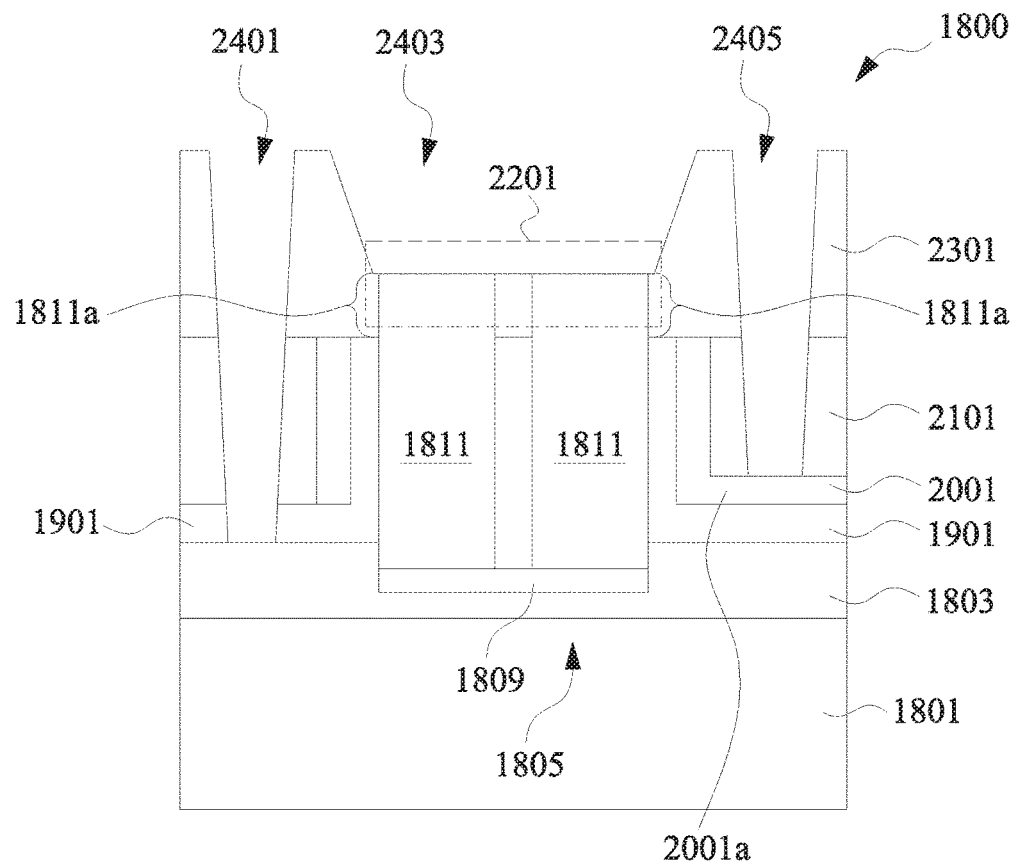

Referring to FIGS. 24A-25B, contact plugs are formed to provide electrical connections to the first source/drain region 1805, the second source/drain region 2201, and the gate electrode 2001. Turning first to FIGS. 24A and 24B, a first opening 2401, a second opening 2403, and a third opening 2405 are formed from a top surface of the second ILD layer 2301. In some embodiments, the first opening 2401, the second opening 2403, and the third opening 2405 are formed using suitable lithography and etching processes. In the illustrated embodiment, the first opening 2401 extends through the second ILD layer 2301, the first ILD layer 2101, the gate dielectric 1901 and exposes the template layer 1803.

The second opening 2403 extends through the second ILD layer 2301 and exposes the portions 1811a of the nanowires 1811 and, hence, exposes the second source/drain region 2201. The third opening 2305 extends through the second ILD layer 2301 and the first ILD layer 2101, and exposes the first portion 2001a of the gate electrode 2001.

Figure 25A:
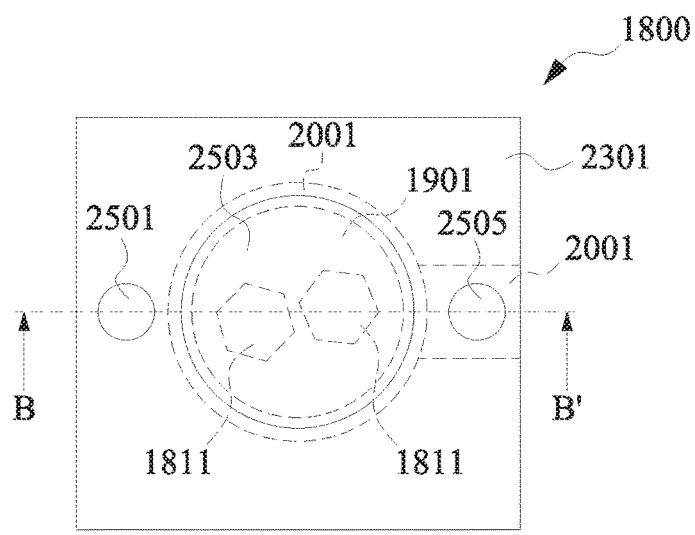
Figure 25B:
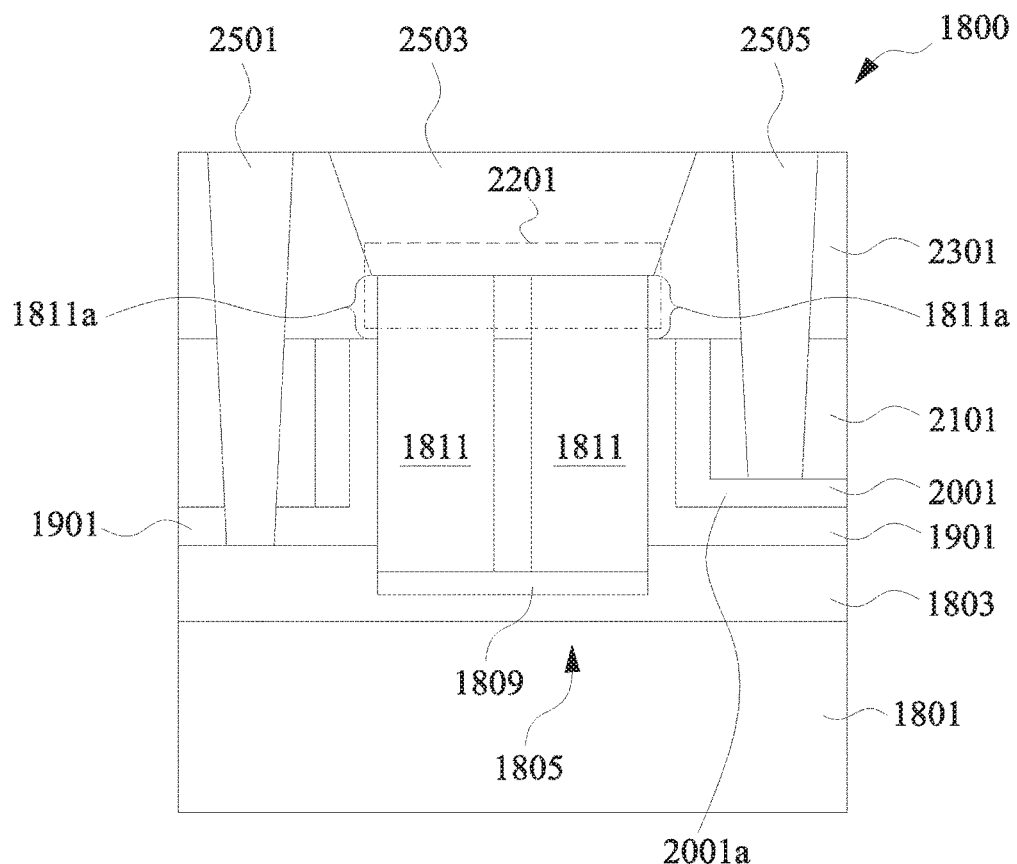

Referring next to FIGS. 25A and 25B, a first contact plug 2501, a second contact plug 2503, and a third contact plug 2505 are formed in the first opening 2401, the second opening 2403, and the third opening 2405, respectively. In some embodiments, the first contact plug 2501, the second contact plug 2503, and the third contact plug 2505 may be formed using same material and methods as the first contact plug 1601, the second contact plug 1603, and the third contact plug 1605 and description is not repeated herein. In the illustrated embodiment, top-view shapes of the first contact plug 2501, the second contact plug 2503, and the third contact plug 2505 are circles. However, in other embodiments, the top-view shapes of the first contact plug 2501, the second contact plug 2503, and the third contact plug 2505 may be polygons such as triangles, rectangles, hexagons, or the like. Furthermore, locations of the first contact plug 2501, the second contact plug 2503, and the third contact plug 2505, as shown in FIGS. 25A and 25B, are provided as examples and are not limiting. In other embodiments, the first contact plug 2501, the second contact plug 2503, and the third contact plug 2505 may be formed at other locations based on design requirements for the semiconductor device 1800.

In some embodiments, further manufacturing steps may be performed on the semiconductor device 1800. For example, metallization layers (not shown) may be formed over the second ILD layer 2301. The metallization layers may comprise one or more dielectric layers, and one or more conductive features formed in the one or more dielectric layers. In some embodiments, the metallization layers are in electrical contact with the first contact plug 2501, the second contact plug 2503, and the third contact plug 2505, and electrically interconnect the semiconductor device 1800 to other devices formed on the substrate 1801. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 1801 may be singulated into separate dies, which may further undergo various packaging processes.

As illustrated in FIGS. 25A and 25B, the semiconductor device 1800 comprises two nanowires 1811, which are configured as channels of the semiconductor device 1800. In other embodiments, the number of the nanowires 1811 and, thus, of the channels may vary according to design specifications of the semiconductor device 1800. In some embodiments where the semiconductor device 1800 is configured as a low-power device, the semiconductor device 1800 may comprise multiple narrow nanowires, which allows for better gate control while maintaining an ON current $I_{ON}$ sufficient for low-power operations. In other embodiments where the semiconductor device 1800 is configured as a high-power device, the semiconductor device 1800 may comprise a few wide nanowires, which allows for a high $I_{ON}$ for high-power operations. In some embodiments, the low-power devices comprise more nanowires than the high-power devices, while a lateral dimension of the nanowires of the high-power devices are larger than a lateral dimension of the nanowires of the low-power devices.

Figure 26:
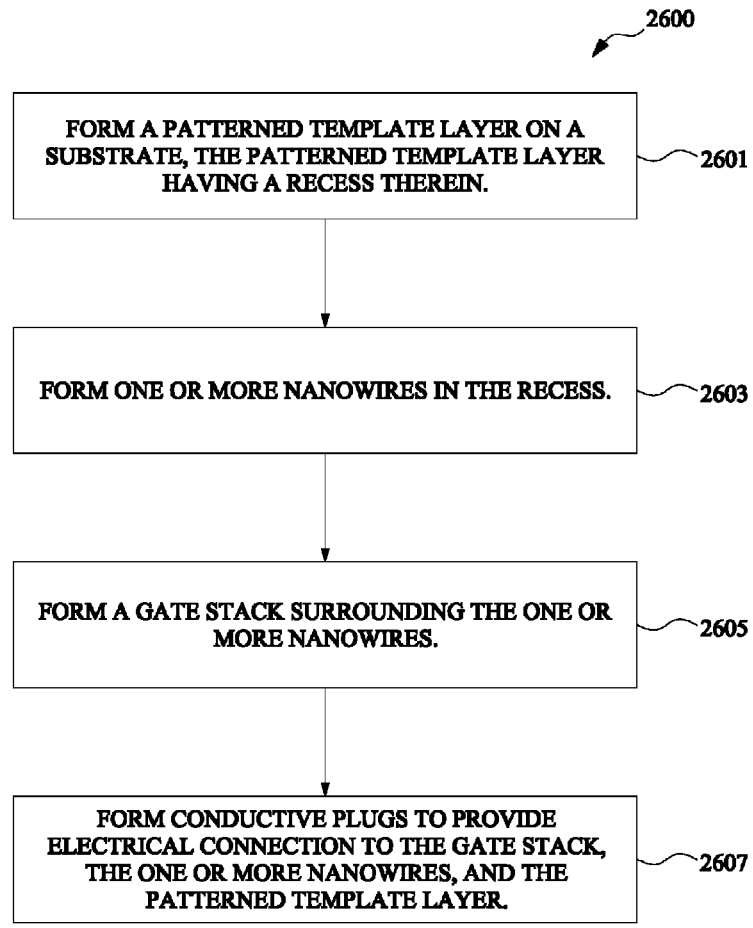
FIG. 26 is a flow diagram illustrating a method of forming a semiconductor device in accordance with some alternative embodiments.

FIG. 26 is a flow diagram illustrating a method 2600 of forming a semiconductor device in accordance with some alternative embodiments. The method 2600 starts at step 2601, wherein a patterned template layer (such as the template layer 1803) having a recess (such as the recess 1807) therein is formed on a substrate (such as the substrate 1801) as described above with reference to FIGS. 18A and 18B. In step 2603, one or more nanowires (such as the nanowires 1811) are formed in the recess as described above with reference to FIGS. 18A and 18B. In some embodiments, the nanowires are formed using an epitaxial growth method described above with reference to FIGS. 5-8. In step 2605, a gate stack (such as the gate dielectric 1901 and the gate electrode 2001) is formed surrounding the nanowires as described above with reference to FIGS. 19A-21B. In step 2607, contact plugs (such as the first contact plug 2501, the second contact plug 2503, and the third contact plug 2505) are formed to provide electrical connection to the gate stack, the one or more nanowires and the patterned template layer as described above with reference to FIGS. 22A-25B.

According to an embodiment, a method of forming a semiconductor device, the method comprises forming a template layer on a substrate, the template layer having a first recess therein. The method further comprises forming a plurality of first nanowires in the first recess, and forming a first gate stack, the first gate stack surrounding the plurality of first nanowires.

According to another embodiment, a method of forming a semiconductor device, the method comprises forming a template layer on a substrate and patterning the template layer to form a first recess and a second recess in the template layer, a width of the first recess being different from the a width of the second recess. The method further comprises epitaxially growing a plurality of first nanowires in the first recess and a plurality of second nanowires in the second recess, forming a first gate stack, the first gate stack surrounding the plurality of first nanowires, and forming a second gate stack, the second gate stack surrounding the plurality of second nanowires.

According to yet another embodiment, a semiconductor device comprises a plurality of first nanowires on a substrate, the plurality of first nanowires having a first width, and a plurality of second nanowires on the substrate, the plurality of second nanowires having a second width, the second width being different from the first width. The semiconductor device further comprises a first gate stack, the first gate stack surrounding the plurality of first nanowires, and a second gate stack, the second gate stack surrounding the plurality of second nanowires.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
   forming a template layer on a substrate, the template layer having a first recess therein;

forming a plurality of first nanowires in the first recess; and forming a first gate stack, the first gate stack surrounding the plurality of first nanowires.

2. The method of claim 1, further comprising:
forming a plurality of second nanowires in a second recess of the template layer, a width of the second recess being different from a width of the first recess, a number of the plurality of second nanowires being different from a number of the plurality of first nanowires; and
forming a second gate stack, the second gate stack surrounding the plurality of second nanowires.

3. The method of claim 1, further comprising:
forming a plurality of second nanowires in a second recess of the template layer, a width of the plurality of second nanowires being different from a width of the plurality of first nanowires; and
forming a second gate stack, the second gate stack surrounding the plurality of second nanowires.

4. The method of claim 1, wherein the template layer comprises a dielectric material, and wherein the first recess exposes a portion of the substrate.

5. The method of claim 4, further comprising:
doping the portion of the substrate to form a first source/drain feature; and
doping portions of the plurality of first nanowires to form a second source/drain feature.

6. The method of claim 1, wherein the template layer comprises a conductive oxide material, and wherein a bottom of the first recess is disposed in the template layer.

7. The method of claim 6, further comprising doping portions of the plurality of first nanowires to form a first source/drain feature, wherein a portion of the template layer disposed below the plurality of first nanowires forms a second source/drain feature.

8. A method of forming a semiconductor device, the method comprising:
forming a template layer on a substrate;
patterning the template layer to form a first recess and a second recess in the template layer, a width of the first recess being different from the a width of the second recess;
epitaxially growing a plurality of first nanowires in the first recess and a plurality of second nanowires in the second recess;
forming a first gate stack, the first gate stack surrounding the plurality of first nanowires; and
forming a second gate stack, the second gate stack surrounding the plurality of second nanowires.

9. The method of claim 8, wherein a number of the plurality of second nanowires is different from a number of the plurality of first nanowires.

10. The method of claim 8, wherein a width of the plurality of second nanowires is different from a width of the plurality of first nanowires.

11. The method of claim 8, wherein the plurality of first nanowires comprises a III-V compound semiconductor material.

12. The method of claim 8, wherein the plurality of first nanowires and the plurality of second nanowires are epitaxially grown using a selective-area metal-organic chemical vapor deposition (MOCVD) method.

13. The method of claim 8, wherein the template layer comprises a conductive oxide material, and wherein at least a portion of the template layer is interposed between the substrate and the plurality of first nanowires.

14. The method of claim 8, wherein the template layer comprises a dielectric material, and wherein the plurality of first nanowires contacts the substrate.

15. A method of forming a semiconductor device, the method comprising:
doping a substrate to form a first source/drain region in the substrate;
forming a template layer over the first source/drain region;
etching the template layer to form a first opening in the template layer, the first opening exposing the first source/drain region;
epitaxially growing a plurality of nanowires in the first opening;
depositing a gate dielectric layer over the substrate, the gate dielectric layer surrounding the plurality of nanowires; and
depositing a gate electrode layer over the substrate, the gate electrode layer surrounding the gate dielectric layer.

16. The method of claim 15, further comprising:
depositing a first dielectric layer over the substrate, the first dielectric layer surrounding the gate electrode layer;
recessing the gate dielectric layer, the gate electrode layer and the first dielectric layer to expose portions of the plurality of nanowires; and
doping the portions of the plurality of nanowires to form a second source/drain region.

17. The method of claim 16, further comprising forming a second dielectric layer over the first dielectric layer, at least a portion of the second dielectric layer surrounding the second source/drain region.

18. The method of claim 17, further comprising etching the first dielectric layer and the second dielectric layer to form a second opening, a third opening and a fourth opening, the second opening extending through the second dielectric layer, the first dielectric layer, the gate dielectric layer, the template layer and exposing the first source/drain region, the third opening extending through the second dielectric layer and exposing the second source/drain region, the fourth opening extending through the second dielectric layer, the first dielectric layer and exposing the gate electrode layer.

19. The method of claim 18, further comprising filling the second opening, the third opening and the fourth opening with a conductive material to form a first conductive plug in the second opening, a second conductive plug in the third opening and a third conductive plug in the fourth opening.

20. The method of claim 15, further comprising etching the gate electrode layer to expose at least a portion of the gate dielectric layer.

* * * * *